US012158627B2

(12) United States Patent
Hemp et al.

(10) Patent No.: US 12,158,627 B2
(45) Date of Patent: Dec. 3, 2024

(54) HIGH SPEED NETWORK DEVICE WITH ORTHOGONAL PLUGGABLE OPTICS MODULES

(71) Applicant: Arista Networks, Inc., Santa Clara, CA (US)

(72) Inventors: Adam Hemp, Belmont, CA (US); Youngbae Park, Milpitas, CA (US); Warren Meggitt, Los Altos, CA (US); Andreas Bechtolsheim, Incline Village, NV (US); Purav Shah, Mountain View, CA (US); Daehwan Daniel Kim, Sunnyvale, CA (US); Robert Wilcox, Saratoga, CA (US)

(73) Assignee: ARISTA NETWORKS, INC., Santa Clara, CA (US)

( * ) Notice: Subject to any disclaimer, the term of this patent is extended or adjusted under 35 U.S.C. 154(b) by 112 days.

(21) Appl. No.: 17/966,769

(22) Filed: Oct. 14, 2022

(65) Prior Publication Data
US 2023/0305247 A1   Sep. 28, 2023

Related U.S. Application Data

(63) Continuation-in-part of application No. 17/705,236, filed on Mar. 25, 2022, now Pat. No. 11,906,800.

(51) Int. Cl.
*H04B 10/00* (2013.01)
*G02B 6/42* (2006.01)
(Continued)

(52) U.S. Cl.
CPC ........... *G02B 6/428* (2013.01); *G02B 6/4261* (2013.01); *G02B 6/4269* (2013.01);
(Continued)

(58) Field of Classification Search
CPC .. G02B 6/4284; G02B 6/4261; G02B 6/4269; H04B 10/40; H04B 10/801
See application file for complete search history.

(56) References Cited

U.S. PATENT DOCUMENTS

| 8,482,917 B2 * | 7/2013 | Rose ................. H05K 7/20727 361/679.48 |
| 10,271,461 B2 * | 4/2019 | Schmidtke ......... H05K 7/20736 |

(Continued)

OTHER PUBLICATIONS

International Search Report and Written Opinion, International Searching Authority, PCT Application No. PCT/US2023/063750, mailed Aug. 18, 2023, 17 pages.

(Continued)

*Primary Examiner* — Agustin Bello
(74) *Attorney, Agent, or Firm* — Fountainhead Law Group, PC

(57) ABSTRACT

The present disclosure describes a network switch design that includes a vertical switch circuit board that is mounted parallel to the front panel of the network switch. The vertical circuit board supports switch chip(s) to process and forward packets and pluggable module connectors to receive pluggable optics modules that provide connections to other network switches. The pluggable module connectors are horizontally oriented to facilitate routing of electrical signal traces. The arrangement of the circuit board, switch chip(s) and pluggable module connectors achieves reduced lengths for the electrical signal traces that connect the switch chip(s) to the pluggable module connectors. The design improves cooling by providing separate airflow regions between the switch chip heatsink(s) and the optics modules.

15 Claims, 32 Drawing Sheets

(51) Int. Cl.
*H01L 23/427* (2006.01)
*H05K 1/02* (2006.01)

(52) U.S. Cl.
CPC .......... *G02B 6/4277* (2013.01); *H01L 23/427* (2013.01); *H05K 1/0209* (2013.01); *H05K 2201/09063* (2013.01); *H05K 2201/09227* (2013.01); *H05K 2201/10189* (2013.01); *H05K 2201/10454* (2013.01)

(56) References Cited

U.S. PATENT DOCUMENTS

| | | | | |
|---|---|---|---|---|
| 10,568,238 | B1* | 2/2020 | Leung | H05K 7/20736 |
| 10,582,639 | B1* | 3/2020 | Chopra | H05K 7/20645 |
| 11,058,034 | B2* | 7/2021 | Leung | H05K 7/1492 |
| 11,906,800 | B2* | 2/2024 | Hemp | H04B 10/801 |
| 2012/0120596 | A1 | 5/2012 | Bechtolsheim | |
| 2014/0098492 | A1* | 4/2014 | Lam | H05K 7/20727 |
| | | | | 165/104.34 |
| 2015/0139223 | A1* | 5/2015 | Mayenburg | H05K 7/20727 |
| | | | | 370/357 |
| 2017/0332519 | A1* | 11/2017 | Schmidtke | H05K 7/20736 |
| 2019/0208290 | A1* | 7/2019 | Olson | H04Q 1/13 |
| 2019/0307014 | A1* | 10/2019 | Adiletta | G06F 9/5083 |
| 2020/0073061 | A1 | 3/2020 | Leigh et al. | |
| 2021/0096306 | A1 | 4/2021 | Raza et al. | |
| 2021/0211785 | A1* | 7/2021 | Rose | H05K 7/20545 |
| 2021/0281932 | A1* | 9/2021 | Chaouch | H04Q 11/0005 |
| 2022/0029380 | A1 | 1/2022 | Kovsh et al. | |
| 2022/0141949 | A1* | 5/2022 | Devalla | H05K 3/366 |
| | | | | 361/721 |
| 2022/0159860 | A1* | 5/2022 | Winzer | H04B 10/27 |
| 2022/0244465 | A1* | 8/2022 | Winzer | G02B 6/4292 |
| 2022/0263586 | A1* | 8/2022 | Winzer | H04B 10/801 |
| 2022/0264759 | A1* | 8/2022 | Sawyer | G06F 1/20 |
| 2022/0279256 | A1* | 9/2022 | Chaouch | H04B 10/801 |
| 2023/0043794 | A1* | 2/2023 | Winzer | G02B 6/4257 |
| 2023/0161109 | A1* | 5/2023 | Pupalaikis | G02B 6/12 |
| | | | | 385/14 |
| 2023/0354541 | A1* | 11/2023 | Cole | H05K 7/10 |
| 2023/0375793 | A1* | 11/2023 | Winzer | G02B 6/428 |

OTHER PUBLICATIONS

Cole et al., "Datacenter Optical Transceivers in the Next Decade—Tu3C: High Performance Computer Networks and High Throughput Transceivers", ECOC 2022 Basel, Sep. 20, 2022, 75 pages.
Non-Final Office Action in Related U.S. Appl. No. 17/705,236 date Jan. 20, 2023, 17 pages.

* cited by examiner

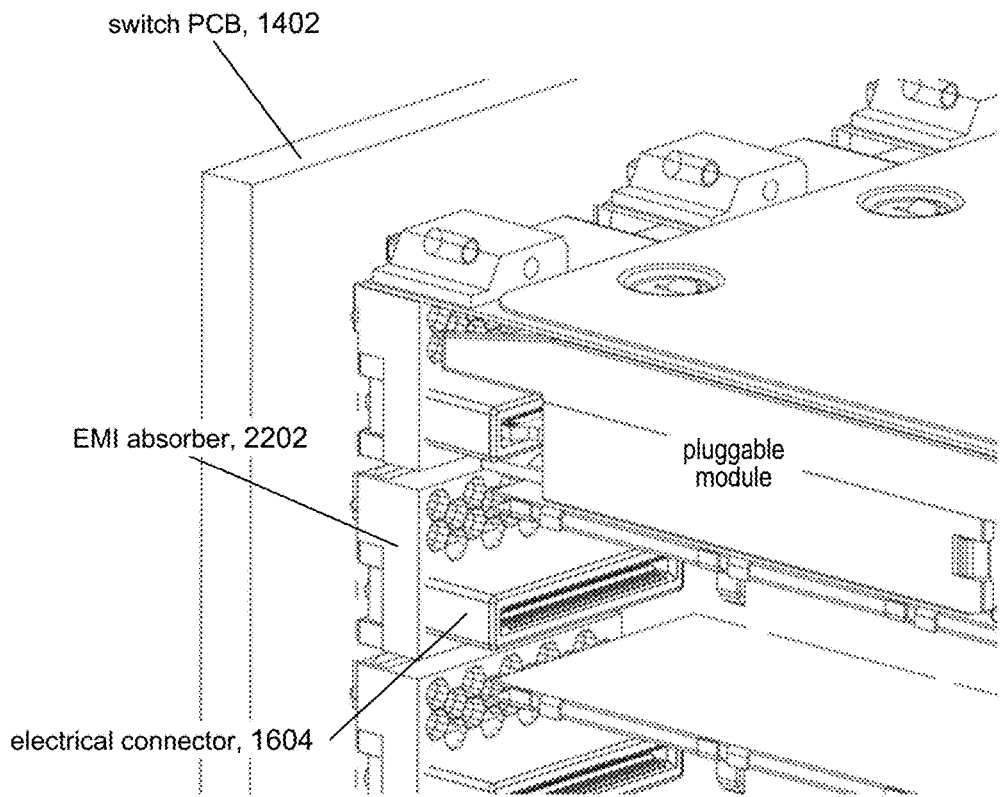
FIG. 22A
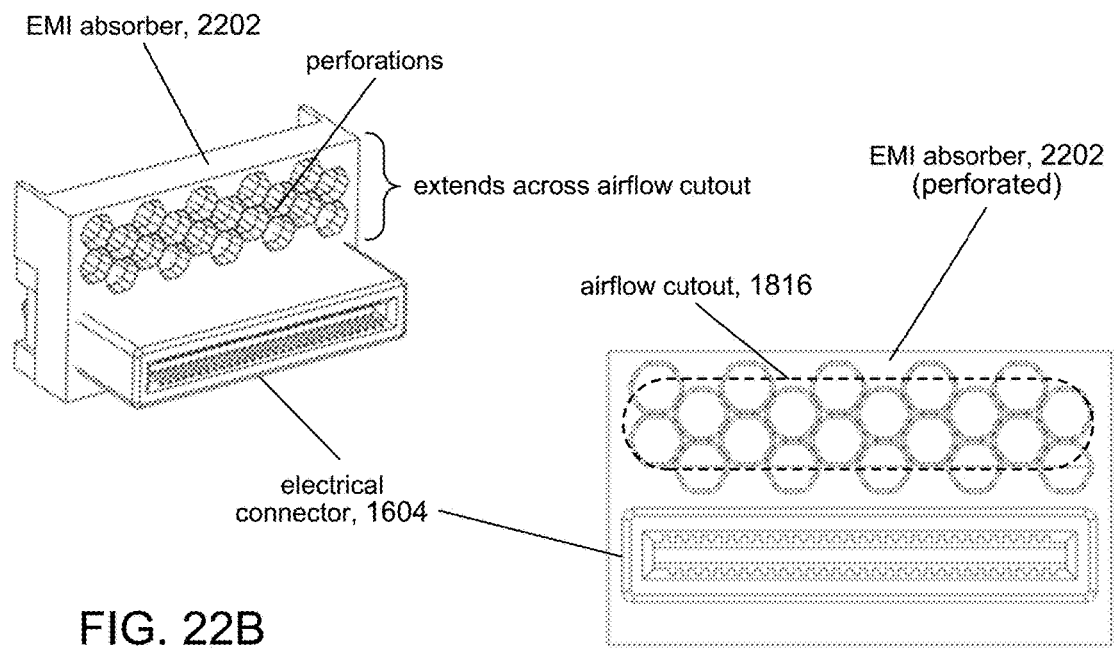
FIG. 22B
FIG. 22C

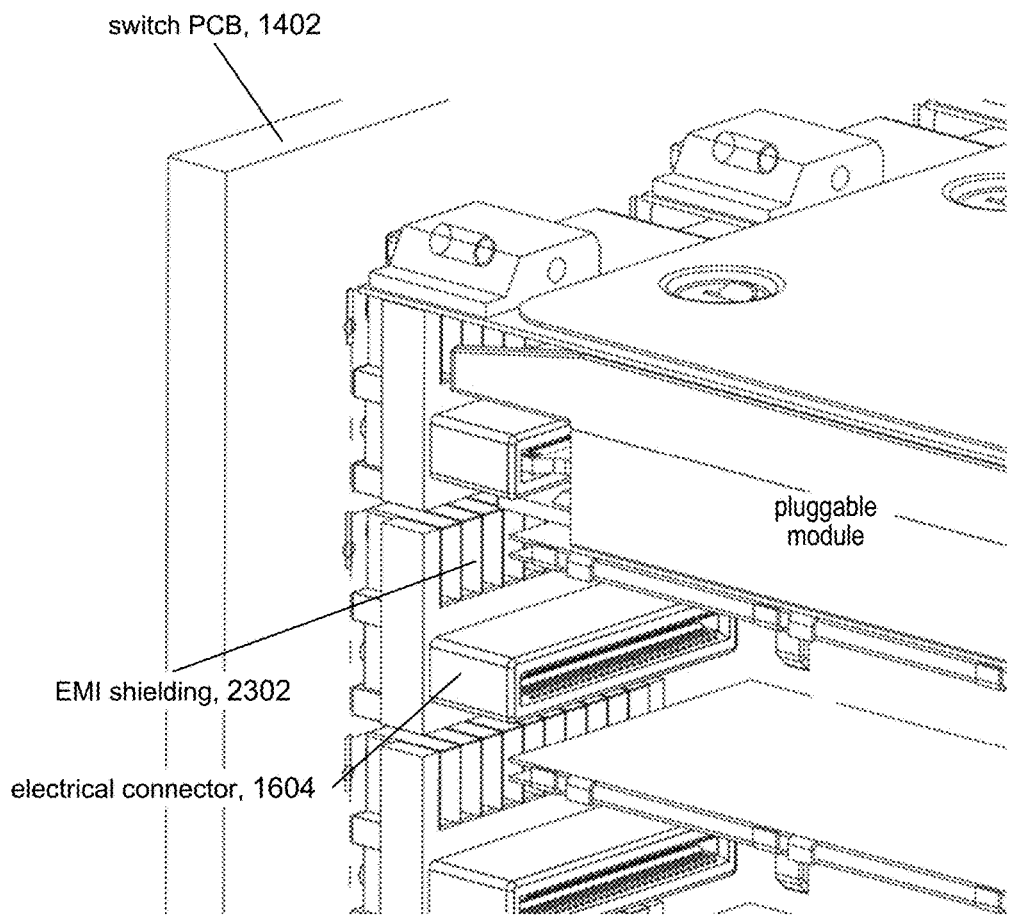
FIG. 23A
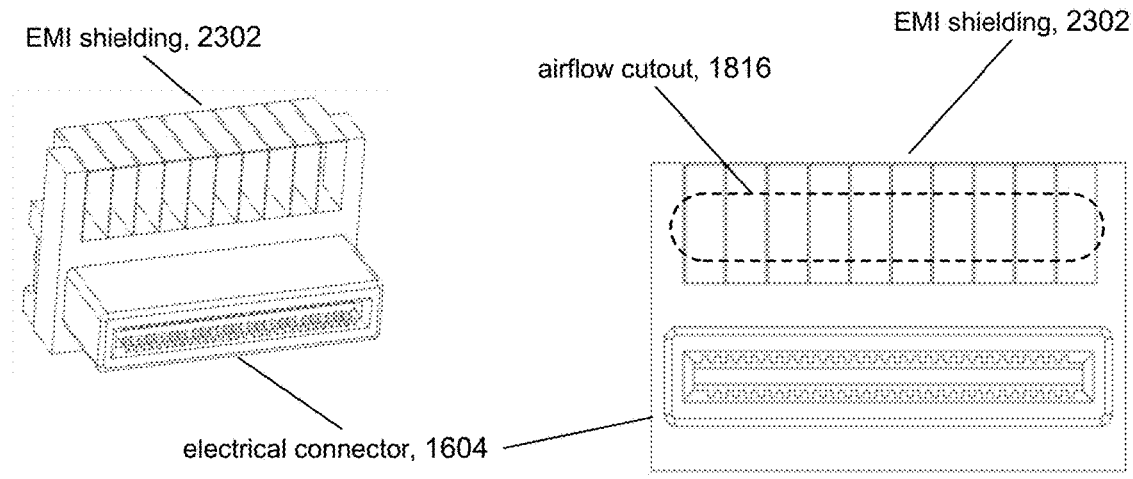
FIG. 23B
FIG. 23C

HIGH SPEED NETWORK DEVICE WITH ORTHOGONAL PLUGGABLE OPTICS MODULES

CROSS REFERENCE TO RELATED APPLICATIONS

This application is a continuation-in-part application and, pursuant to 35 U.S.C. § 120, is entitled to and claims the benefit of earlier filed application U.S. application Ser. No. 17/705,236 filed Mar. 25, 2022, the content of which is incorporated herein by reference in its entirety for all purposes.

This application is related to U.S. application Ser. No. 16/829,902 filed Mar. 25, 2020, the content of which is incorporated herein by reference in its entirety for all purposes.

BACKGROUND

The present disclosure relates to the field of computer network systems, and in particular to the design of network switches for high-speed network switching and routing systems.

Network switches (also known as routers, switching hubs, or simply "switches") are computer networking devices that generally use packet switching to receive, process, and forward data in computer networks. Network switches typically have a number of interface ports that can be individually configured with different types of pluggable optical transceivers or electrical cables to connect to other network switches or devices.

Network switches are typically built with a circuit card that includes one or more switch chips, which perform packet processing, and multiple interface ports. The interface ports typically utilize industry standardized pluggable optical transceiver module form factors such as SFP (Small Form Factor Pluggable), QSFP (Quad Small Form Factor Pluggable), QSFP-DD (QSFP Dual Density), OSFP (Octal Small Form Factor Pluggable), or OSFP-XD (OSFP Extended Density).

The signaling speed for the electrical lanes connecting the switch chips to the interface ports has increased significantly in the last few years from 10 Gbps (Gigabits per second) to 100 Gbps, or 112 Gbps including coding overhead for forward error correction. With PAM4 (Pulse Amplitude Modulation 4-level) modulation, the corresponding signaling rate is 56 Gbaud (Giga-baud) and the Nyquist frequency is 28 GHz.

Next-generation networking systems are expected to use electrical lanes with a nominal data rate of 200 Gbps per lane, or approximately 224 Gbps including coding overhead for forward error correction. With PAM4 modulation, a 224 Gbps data rate translates to a signaling rate of 112 Gbaud with a Nyquist frequency of 56 GHz.

Doubling the data rate of the electrical lanes from 112 to 224 Gbps roughly doubles the losses across printed circuit boards traces, which in turn means that signals at twice the speed will only travel approximately half as far across a printed circuit board. This reduced electrical signal reach is no longer compatible with conventional switch card layouts where the trace length from the switch chip to the most distant interface port is typically at least 10 inches.

One solution to this problem is to use coaxial cables that have far lower insertion losses than printed circuit traces to connect the switch chip to the interface ports. However such cables, also known as "flyover cables," add significant costs, are challenging to manufacture, and can impede airflow within the device enclosure.

A second solution to the problem is to use on-board optics, which are placed on the switch card very close to the switch chip thereby reducing the electrical trace length between the switch chip to the optics module to a minimum. On-board optics modules present a serviceability challenge because they cannot be replaced upon failure without opening the network chassis to get access to the module. In addition, on-board optics require additional fiber connections from the on-board optics module to the front-panel optical connector, which add significant cost and cause additional optical signal losses. As a result, on-board optics have not been widely adopted by the industry.

A third solution to the problem is the use of so-called co-packaged optics (CPOs), which place the optical modulator directly on the switch chip package. This minimizes the length of the electrical channel between the switch chip and the optics and allows the electrical channel to operate at lower power levels. However, co-packaged optics have their own significant challenges, including reliability, serviceability, manufacturability, and the ability to mix and match different optics technologies. Like on-board optics, co-packaged optics also require additional fiber connections to the front panel which add cost and cause optical signal losses. As a result, co-packaged optics have not been widely adopted by the industry.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions. In the accompanying drawings:

FIGS. 22A, 22B, and 22C show an example of an EMI blocking/absorbing element in accordance with the present disclosure.

FIGS. 23A, 23B, and 23C show an example of an EMI blocking/absorbing element in accordance with the present disclosure.

DETAILED DESCRIPTION

Figure 1:
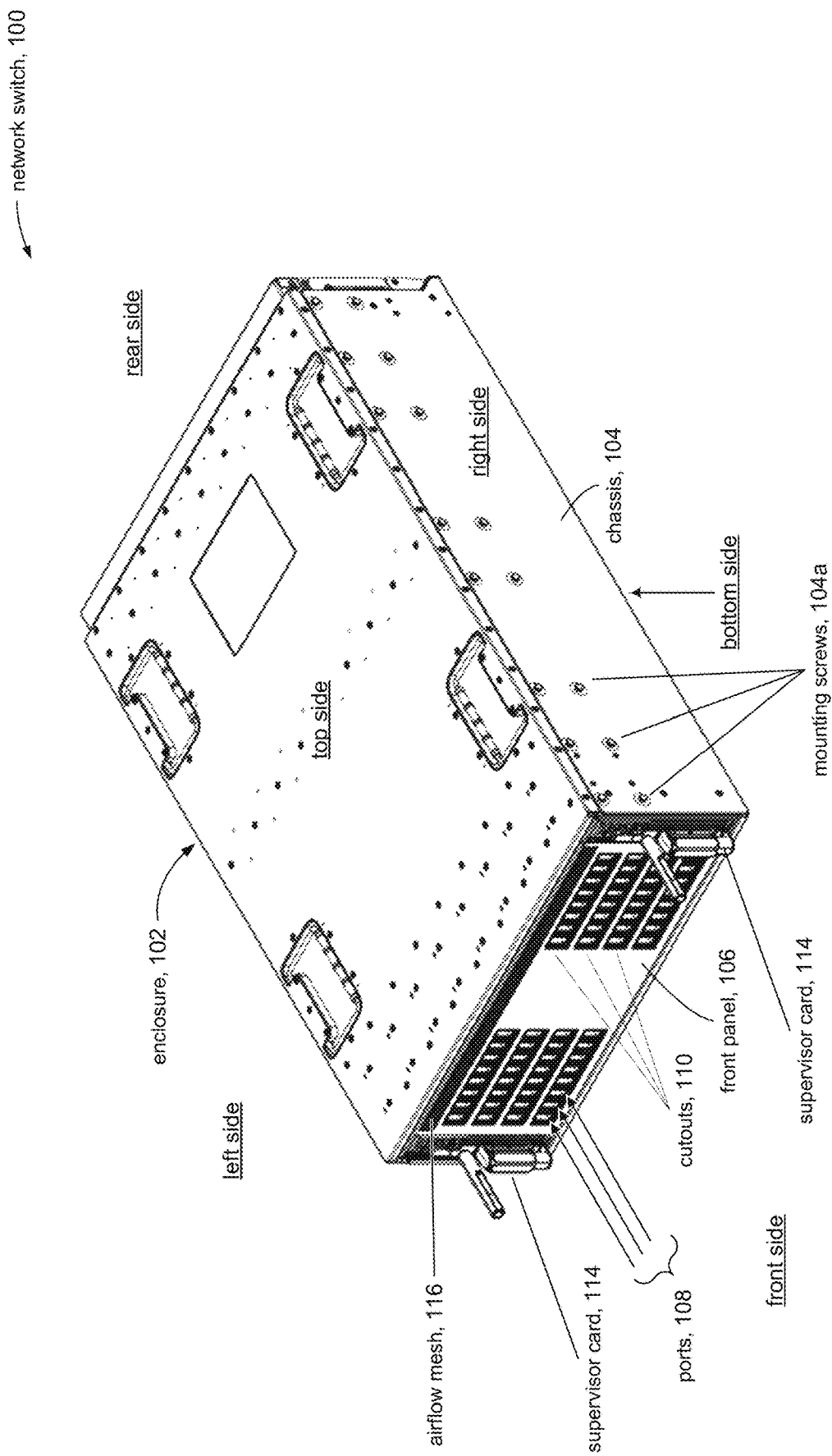
FIG. 1 shows an example network switch in accordance with the present disclosure.

As explained above, known design approaches do not provide a satisfactory low-cost solution for the interconnection between high-speed switch chips and interface ports using printed circuit board traces at speeds of 200 Gbps or above. An objective of the present disclosure is to allow for the design of such high-speed network switches with electrical data transmission speeds of 200 G and above using printed circuit board traces, without the need for flyover cables, on-board optics, or co-packaged optics.

It is an objective of the present disclosure to provide a switch circuit board design that minimizes the trace length of the electrical channels for all the benefits that result from a shorter electrical channel, including lower signal loss and better signal margins.

It is a further object of the present disclosure to provide an efficient method of good air cooling to both the switch chip and the optics modules in a network switch chassis.

It is still another object of the present disclosure to reduce the size of the switch circuit card to reduce cost.

Other objects and advantages of the disclosure will become apparent as the description proceeds.

Vertical SCA

In one aspect of the present disclosure, the network switch comprises a switch card assembly (SCA) that includes a switch printed circuit board (PCB) with one or more switch chips, interface ports, and supporting circuitry. The switch chips provide the network switching function among the interface ports.

In accordance with an embodiment of the present disclosure, the interface port connectors and cages for the pluggable optics modules (POM) are mounted on the SCA to receive the pluggable optics modules. The POM connectors are mounted in an orthogonal relation to the surface of the Switch PCB. When the Switch PCB is housed in a network switch chassis, the Switch PCB lies in a plane co-planar to the front panel, and the front ends of the POM connectors and cages are directly accessible from the front panel. This arrangement allows the pluggable optics modules to be inserted through the front panel and received by the connectors to connect directly to the Switch PCB that carries the switch chips.

The orthogonal orientation of the POM connectors relative to the Switch PCB allows for a higher density of pluggable optics modules to be deployed closer to the switch chips than in conventional designs. This allows the electrical connections between the switch chip and the POM connectors to be made with printed circuit traces that are sufficiently short in length so as to enable high-speed signaling (e.g., 200 Gbps), rather than having to use the more costly alternatives (e.g., fly-over cables, fiber optics) described above.

By comparison, in a conventional switch design, the pluggable optics modules are arranged along the edge parallel relative to the switch motherboard. The pluggable optics modules that are furthest from the switching chips have longer printed circuit traces to the switching chips. At very high signaling speeds, the electrical channel with printed circuit board traces no longer works for the longer traces. As a result, solutions such as coaxial cables or on-board optics with fiber optic cables are required, which are significantly more costly compared to PCB traces. In addition, on-board optics compared to pluggable optics present many additional challenges in terms of configurability, reliability, serviceability, and manufacturability.

Airflow, 1$^{st}$ Aspect

In another aspect of the present disclosure, the SCA includes a heat sink assembly comprising a heat collector (heat plate) connected to a heat dissipator (heatsink fins) via heat transfer conduits. The heat collector is in thermal contact with the one or more switch chips to absorb the heat generated by the switch chips and transfer that heat to the heat dissipator via the thermal conduit. In accordance with the present disclosure, the heat dissipator is positioned along the width of the upper edge of the Switch PCB near the front panel of the chassis, directly in the path of the airflow. Ambient air from the outside is pulled by fans, located in the rear of the chassis, across the heat dissipator and into the rear air space (air plenum) of the network switch chassis, from which the heated air is exhausted from the chassis. Accordingly, the switch chips are cooled with air at ambient air temperature rather than with air that is preheated from the optics modules as in conventional switch chassis designs.

In a conventional design, the one or more switch chips are downstream of the pluggable optics modules in the center of the network switch chassis. As such, ambient airflow passes across and cools the pluggable optics modules before entering the space occupied by the switch chips. Accordingly, the air used to cool the switch chips has been preheated by the pluggable optics modules, resulting in less effective cooling of the switch chips.

Airflow, 2$^{nd}$ Aspect

In another aspect of the present disclosure, the Switch PCB includes slotted openings (cutouts) through the Switch PCB where the POM cages are mounted. Each POM cage includes one or more airflow channels that substantially align with the slotted openings formed through the Switch PCB. The air channels in the POM cage allow ambient air to be drawn into the POM connector, flow across a pluggable optics module received in the POM connector, and exit through the Switch PCB opening into the air plenum space, from which the heated air is exhausted from the chassis.

Power Delivery

In another aspect of the present disclosure, a point of load power converter PCB is located behind the Switch PCB to deliver power to the circuitry on the Switch PCB. Electric current from the power PCB can be provided to the Switch PCB via copper slugs sandwiched between the power PCB and the Switch PCB. The power PCB has cutouts substantially in line with the cutouts in the Switch PCB to allow the air to flow through both the Switch PCB and the Power PCB.

In the following description, for purposes of explanation, numerous examples and specific details are set forth in order to provide a thorough understanding of embodiments of the present disclosure. Particular embodiments as expressed in the claims may include some or all of the features in these examples, alone or in combination with other features described below, and may further include modifications and equivalents of the features and concepts described herein.

FIG. 1 shows a network switch 100 in accordance with the present disclosure. Network switch 100 can be any packet processing and forwarding equipment that has network traffic switching, routing, or other network traffic forwarding capabilities and can be a switch, router, bridge, gateway, and the like. In some embodiments, network switch 100 includes an enclosure (housing, etc.) 102 to house the components that comprise the device. The enclosure 102 comprises a chassis 104 and a front panel (faceplate) 106. In some embodiments, chassis 104 can be configured for rack mounting (e.g., via mounting screws 104a), for example, in a 19-inch rack, a 23-inch rack, and the like.

Network switch 100 provides physical interface ports 108 to enable connections to other network switches or devices such as servers and storage. Front panel 106 has port access cutouts (openings) 110 formed through the front panel. Port access cutouts 110 provide access to physical ports 108 for receiving data cables such as Ethernet cables, fiber optic cables, etc. In accordance with some embodiments, physical ports 108 are configured to receive removable pluggable optics modules (e.g., FIG. 6).

In accordance with the present disclosure, front panel 106 further includes an airflow mesh 116 comprising an arrangement of openings formed through the front panel to remove heat generated by one or more switch chips of network switch 100. Network switch 100 includes fans (e.g., FIG. 5) to draw ambient air from the front side of the network switch, through the openings (110, 116) of front panel 106, into chassis 104, across the interior volume of the chassis, and out of the chassis through exhaust openings at the rear side of the chassis.

Figure 2:
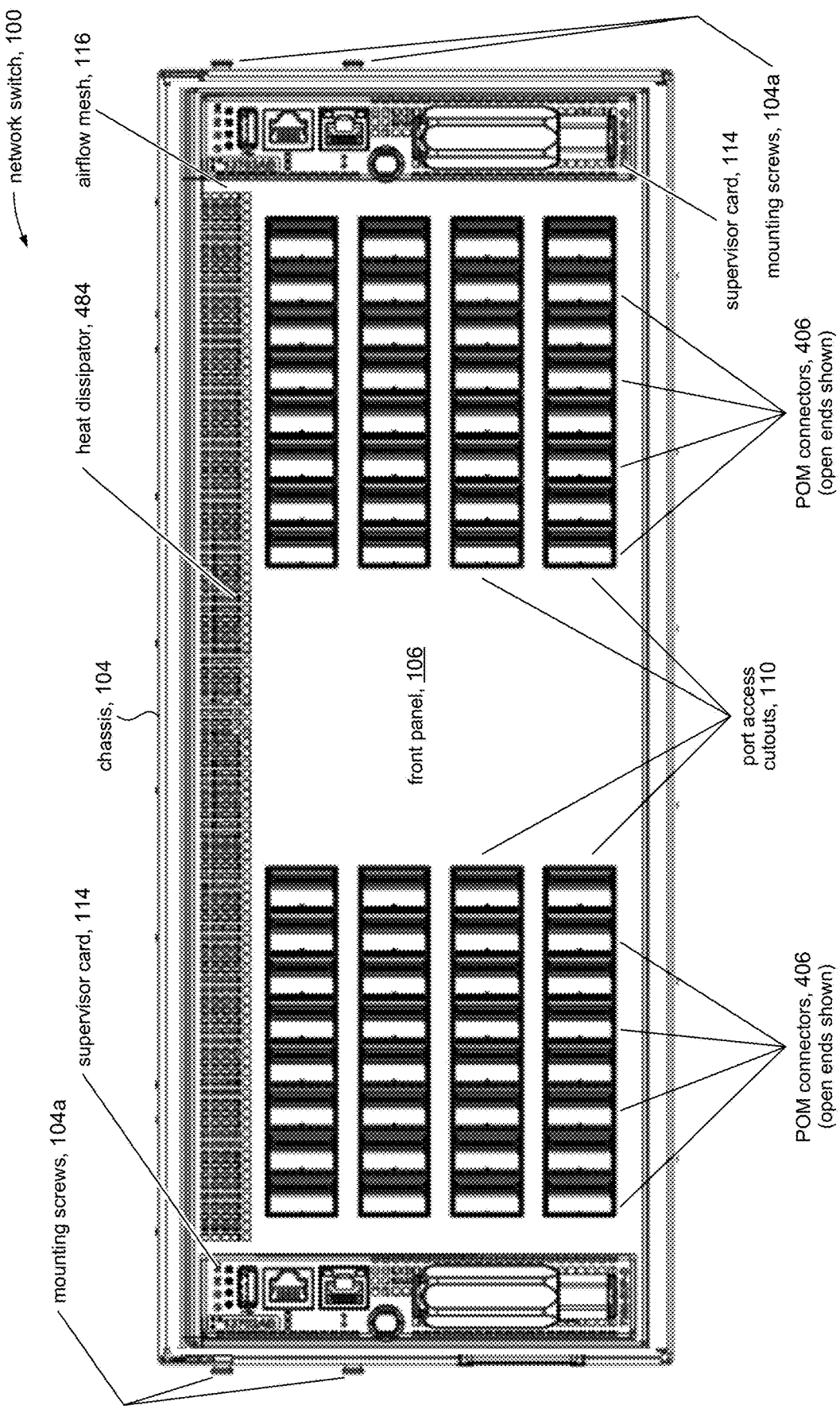
FIG. 2 shows a front-facing view of the example network switch.

FIG. 2 shows a front-facing view of network switch 100. The figure depicts a heat dissipator component 484 (FIG. 4A) of a heatsink assembly in accordance with the present disclosure to cool the switch chip(s) of network switch 100. Heat dissipator 484 is disposed within chassis 104 of the network switch behind the airflow mesh 116. In accordance with the present disclosure, heat dissipator 484 is directly exposed to ambient air that is drawn in through airflow mesh 116 by fans in the rear of the chassis. In other words, ambient airflows across heat dissipator 484 without first passing across other electronic devices that would increase the temperature of the ambient air.

FIG. 2 further shows that open ends of pluggable optical module (POM) connectors 406 (FIG. 4A) are exposed through port access cutouts 110. As can be seen in the figure, the open ends of the POM connectors are exposed to ambient air. Accordingly, a flow of ambient air that is drawn in through the port access cutouts will flow through the interior space of POM connectors 406 and provide cooling of pluggable optics modules (not shown) plugged into the POM connectors. As such, and in accordance with the present disclosure, ambient airflow drawn in across front panel 106 can be viewed as having two zones: a first airflow zone through airflow mesh 116 and a second airflow zone, separate from the first airflow zone, through port access cutouts 110. This means both the switch chip and the pluggable optics modules receive intake air at ambient temperature. This design represents a significant improvement over conventional airflow designs where the air used to cool the switch chip air has been preheated by the pluggable optics modules.

Figure 3:
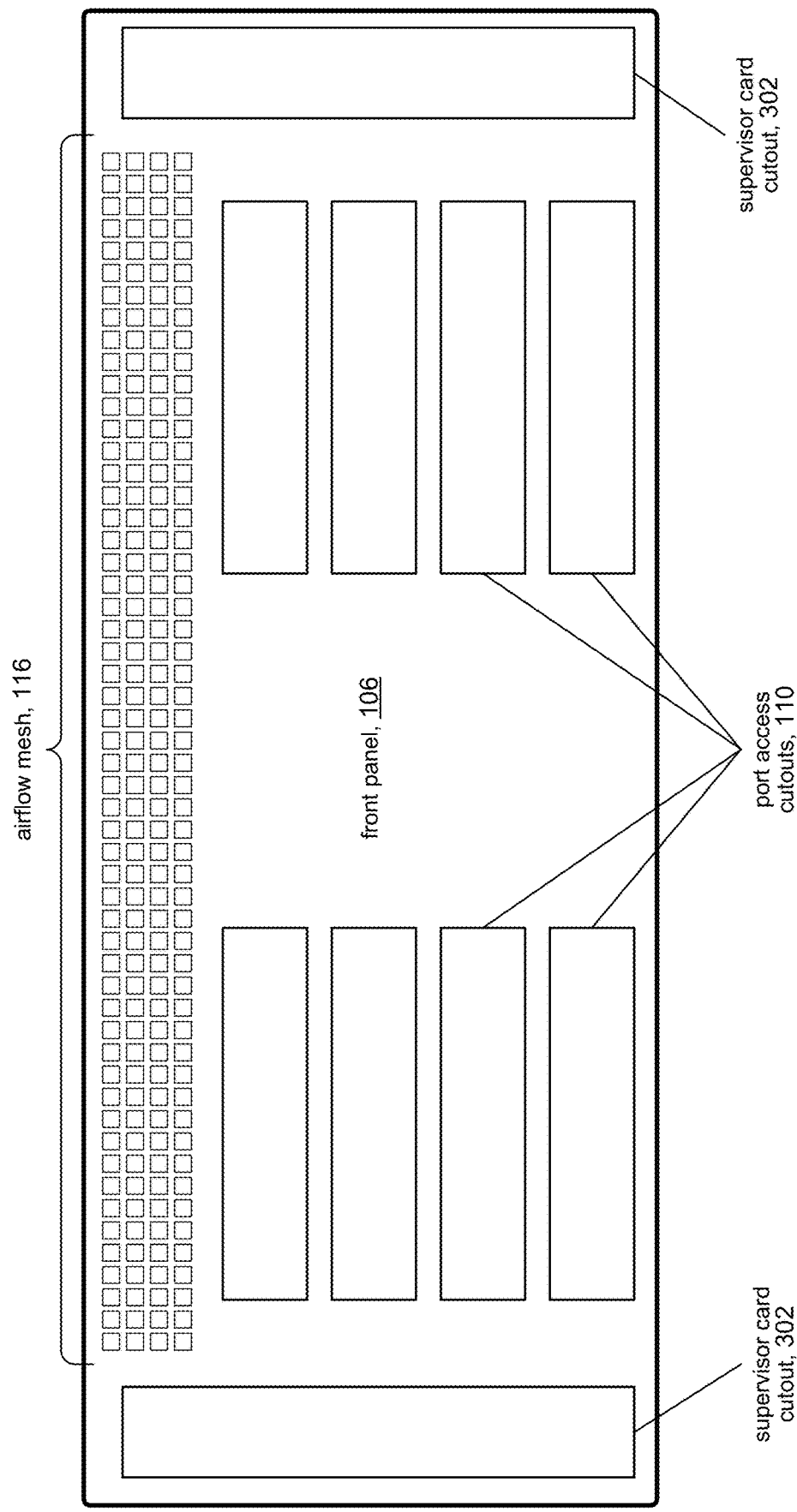
FIG. 3 is a representation of an example faceplate in accordance with the present disclosure.

FIG. 3 shows front panel 106 removed from chassis 104. The front panel has port access cutouts 110 to provide access to the POM connectors, and openings that form airflow mesh 116. Front panel 106 further includes cutouts 302 for the supervisor cards 114.

Figure 4A:
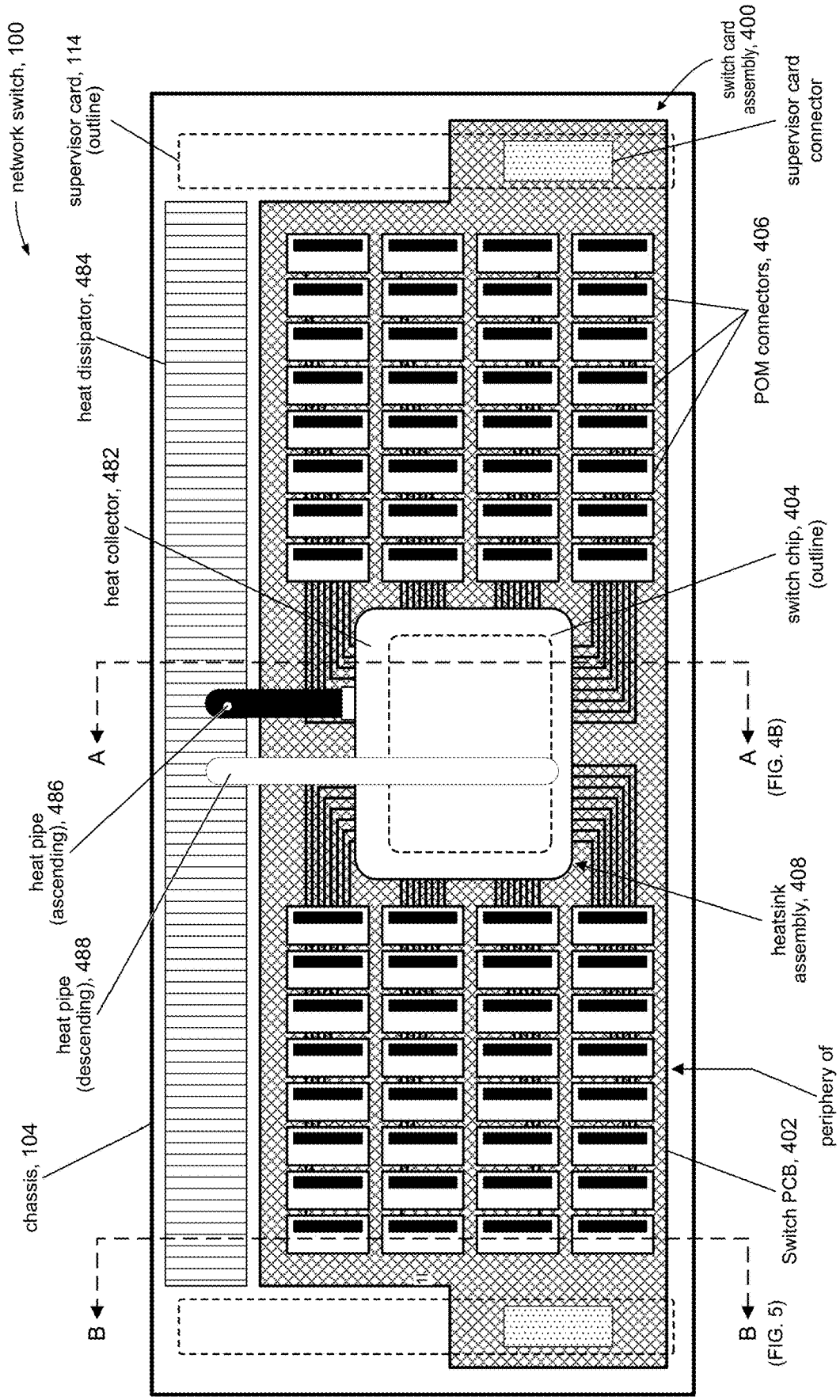
FIGS. 4A and 4B illustrate aspects of an example switch card assembly in accordance with the present disclosure.
Figure 4B:
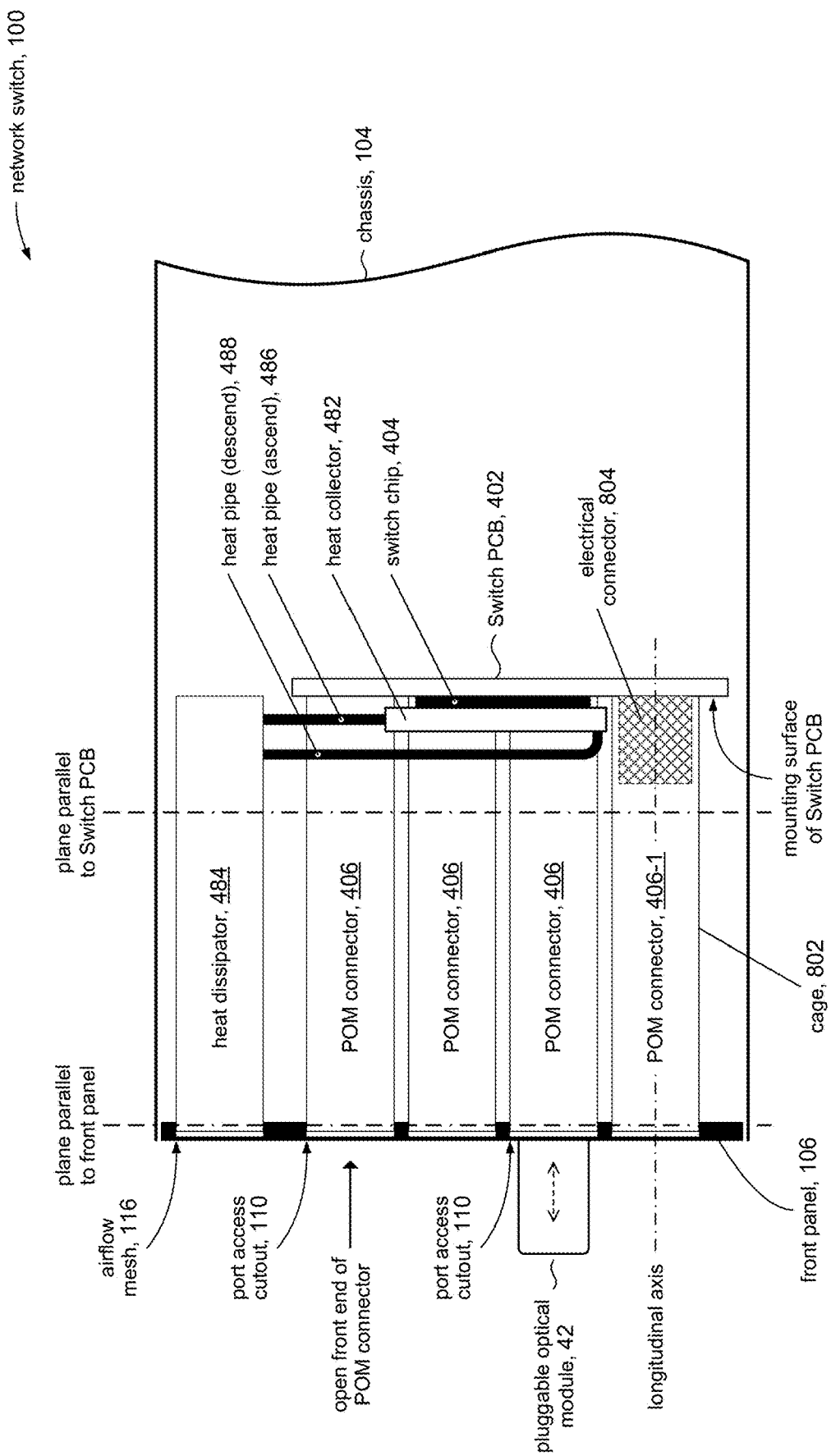

Refer now to FIGS. 4A and 4B. FIG. 4A shows the front-facing view of network switch 100, as shown in FIG. 2, but with front panel 106 removed and looking into chassis 104. FIG. 4A is a schematic representation of a switch card assembly (SCA) 400 in accordance with the present disclosure. FIG. 4B is a side view of network switch 100 showing details for the SCA 400 taken along view line A-A.

In some embodiments, SCA 400 comprises a switch printed circuit board (Switch PCB) 402 to carry switch chip 404 which provides the network data packet processing and packet forwarding functionality of network switch 100. Additional circuit components (not shown) to support the operation of switch chip 404 can also be mounted on the Switch PCB. Although these figures show a single switch chip configuration, it will be appreciated that embodiments of a switch card assembly in accordance with the present disclosure can include multiple switch chips (e.g., FIG. 13).

SCA 400 further comprises POM connectors 406 to receive pluggable optical modules. It is understood that POM connectors 406 can be configured to receive pluggable optical modules having currently available form factors such as, SFP, QSFP, QSFP-DD, OSFP, and OSFP-XD, but are not limited to such form factors. As will be shown and described in more detail below, a POM connector comprises a cage 802 (FIG. 8) to receive a pluggable optical module 42 and an electrical connector 804 that mechanically engages with and electrically connects to the pluggable optical module. The disclosed embodiments show the POM connectors oriented such that the openings are vertical, see FIGS. 4A and 8 for example. It will be appreciated that in other embodiments, the POM connectors can be rotated 90° with the openings oriented horizontally, and in general can be rotated by any angle.

In accordance with the present disclosure, POM connectors 406 are distributed across the surface of Switch PCB 402, rather than along an edge of a PCB as in conventional designs. Notably, each POM connector 406 mounts directly on the Switch PCB 402. FIG. 4A, for example, shows two 4×8 arrays of POM connectors for a total of 64 connectors mounted on the surface of Switch PCB 402. POM connectors 406 are mounted on Switch PCB 402 in orthogonal orientation relative to the surface of Switch PCB 402, with the longitudinal axis of each POM connector (e.g., 406-1, FIG. 4B) orthogonal to the plane of the Switch PCB. As such, when installed in the chassis 104, Switch PCB 402 is vertically oriented in a plane substantially parallel to front panel 106 and the open front ends of POM connectors 406 are substantially aligned with port access cutouts 110 of the front panel, as illustrated in FIG. 4B for example, to allow for the removal and installation of pluggable optical modules. The orthogonal arrangement of POM connectors 406 on the surface of Switch PCB 402 allows the connectors to be positioned closer to the switch chip, enabling shorter lengths of electrical signal traces between the switch chip and the POM connectors as compared to edge-mounted POM connector designs.

SCA 400 further comprises a heatsink assembly 408 to remove heat generated by switch chip 404. In some embodiments, for example, heatsink assembly 408 can be based on a heat removal design called a thermo-siphon. The heatsink assembly includes a heat collector 482 that is in thermal contact with switch chip 404. The heat collector is connected to a heat dissipator 484 via ascending heat pipe 486 and descending heat pipe 488. Heat dissipator 484 can be substantially aligned with airflow mesh 116 formed through front panel 106. Heatsink assembly 408 is a closed system containing a fluid that circulates between heat collector 482 and heat dissipator 484 via heat pipes 486, 488. Heat generated by switch chip 404 is absorbed by the fluid, which evaporates the fluid. The evaporated fluid rises in ascending heat pipe 486 into heat dissipator 484, where it condenses back to fluid and returns to the heat collector via descending heat pipe 488. For network switches with multiple switch chips, each switch chip would have a dedicated heatsink similar to the one described above.

In accordance with the present disclosure, the heat dissipator 484 is spaced apart from the POM connectors 406 in a vertical plane parallel to Switch PCB 402. This can be seen in the front-facing view of FIG. 4A and more explicitly in the side view of FIG. 4B. As shown FIG. 4B, in some embodiments, the front end of heat dissipator 484 and the open ends of POM connectors 406 are substantially aligned to front panel 106. It will be appreciated, however, that in other embodiments the heat dissipator can be set back from the front panel.

In accordance with embodiments of the present disclosure, SCA 400 with all its components is removable from chassis 104 as a replaceable unit from the front end of the chassis for ease of servicing the network switch.

Figure 4C:
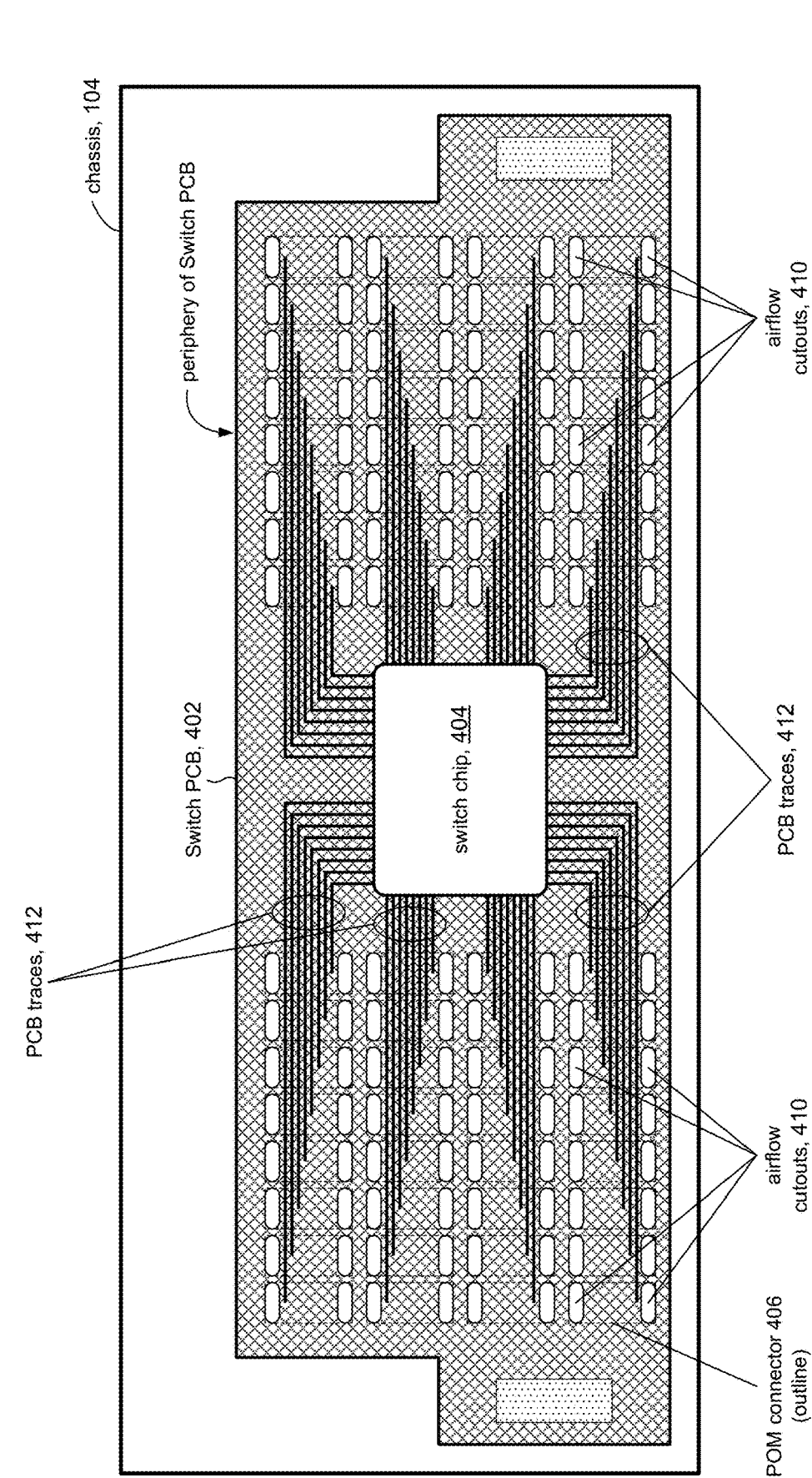
FIG. 4C illustrates details of an example switch printed circuit board in accordance with the present disclosure.
Figure 4D:
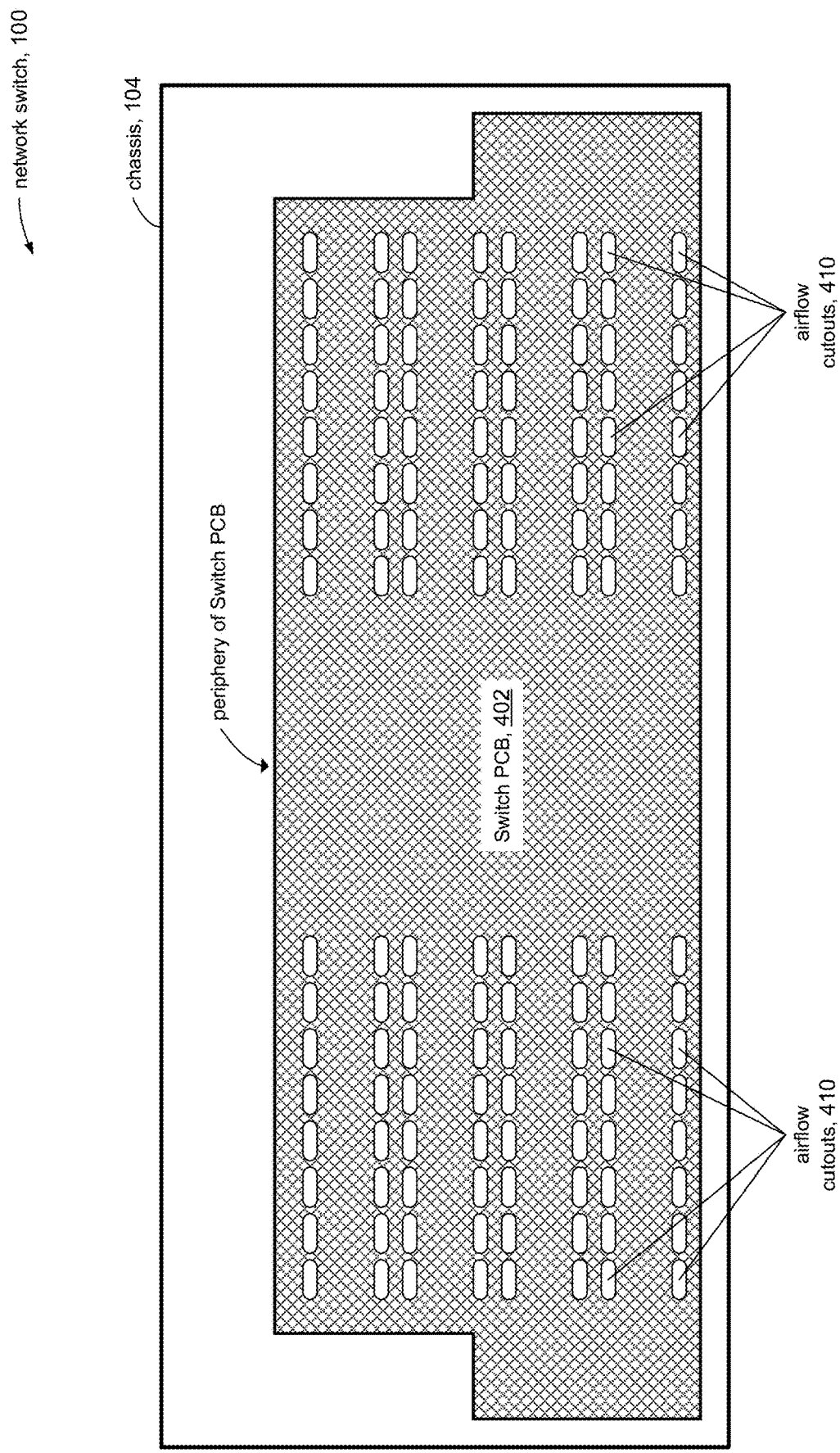
FIG. 4D illustrates additional details of an example switch printed circuit board in accordance with the present disclosure.

FIGS. 4C and 4D show SCA 400 with the POM connectors 406 and heat assembly 408 components removed, revealing additional details of Switch PCB 402. In accordance with the present disclosure, Switch PCB 402 includes connector airflow cutouts 410 that are substantially aligned with respective POM connectors 406 (shown in outline). Airflow cutouts 410 are formed through Switch PCB 402. As will be discussed in more detail below, the airflow cutouts allow for air that enters the interiors of the POM cages to flow through the Switch PCB.

FIG. 4C further shows that Switch PCB 402 includes PCB traces 412 that can be formed on top, bottom, or inner layers of the Switch PCB. It is noted that the PCB traces shown in the figure are merely schematic representations for illustration purposes. FIG. 4C, for example, shows PCB traces 412 for connecting switch chip 404 to POM connectors 406. It is understood, however, that PCB traces 412 include data lines, control lines, power buses, ground lines, and so on.

As noted above, because the POM connectors are mounted orthogonally on the switch circuit board that carries the switch chip, this surface-mounted arrangement allows for the PCB traces that connect the POM connectors to the switch chips to be sufficiently short so as to support high-speed signaling with acceptable signal loss. Layout designs in accordance with the present disclosure avoid having to use more costly off-board wiring techniques such as fly-over cable and fiber optic cables.

FIG. 4D shows Switch PCB 402 with switch chip 404 and PCB traces removed to more clearly illustrate airflow cutouts 410 formed through Switch PCB 402.

Figure 5:
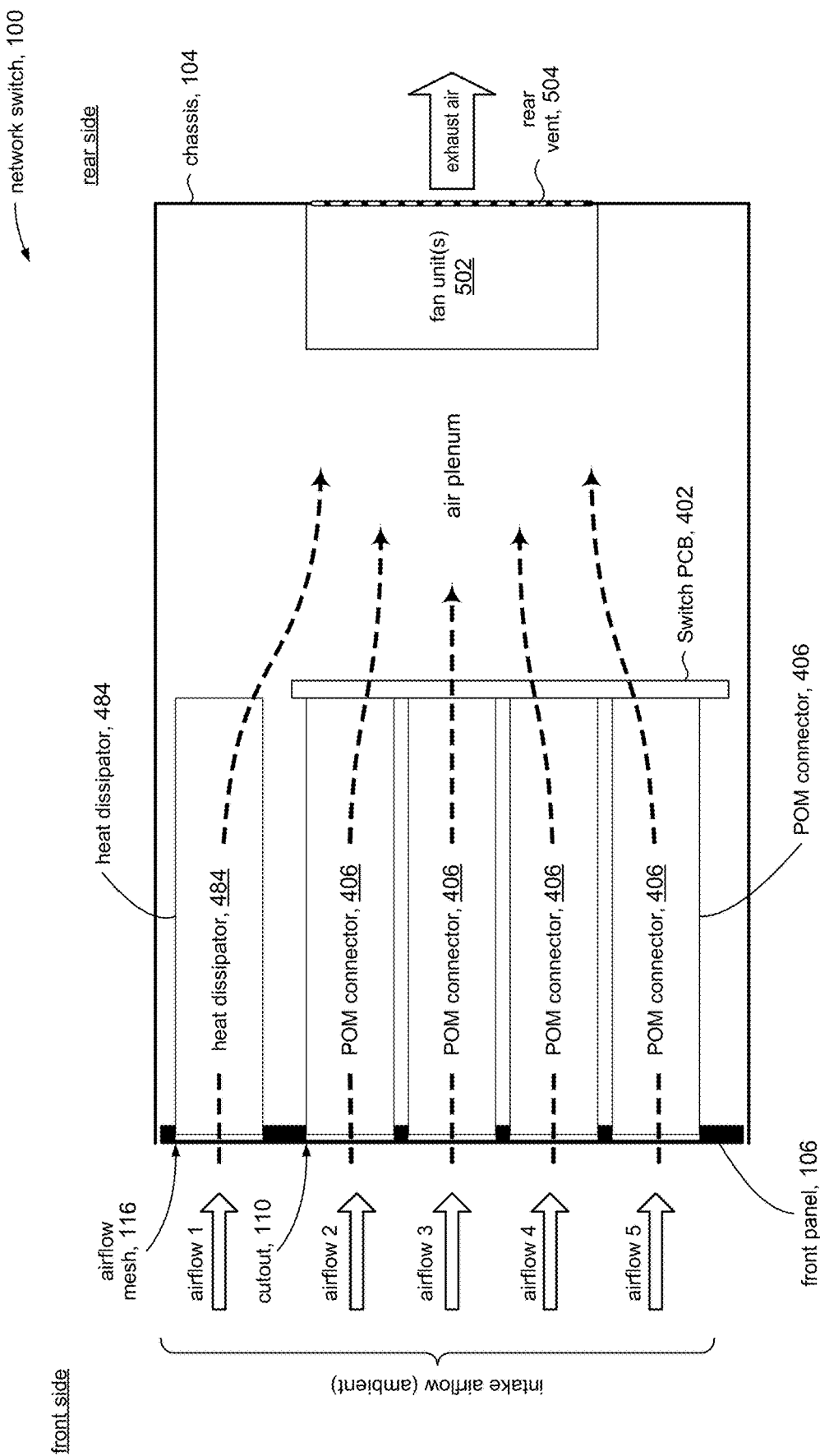
FIG. 5 is a schematic illustration of airflow through the example network switch in accordance with the present disclosure.

FIG. 5 is a side view of network switch 100 showing details for SCA 400 taken along view line B-B shown in FIG. 4A. FIG. 5 also shows additional components in network switch 100. A fan unit 502 can create a low pressure zone (relative to ambient pressure) within the interior of chassis 104 between Switch PCB 402 and the rear of the chassis. The low pressure zone creates a pressure gradient that sets up a flow of intake ambient air into chassis 104 through openings in front panel 106 toward fan unit 502. A flow of ambient air moves through openings 110, 116 in front panel 106, across heat dissipator 484 and pluggable optics modules received in POM connectors 406, into the air plenum in chassis 104, across the air plenum, and through the fans. Exhaust air can be expelled by the fans through a rear vent 504.

As illustrated in FIG. 5, openings 110, 116 formed through front panel 106 can be viewed as partitioning the intake airflow into separate zones of airflow. For example, the portion of the intake airflow that flows into and through airflow mesh 116 can be referred to as zone 1 airflow. The zone 1 airflow flows into heat dissipator 484 to remove heat produced by switch chip 404. Zone 2 airflow represents a portion of the intake airflow that flows through an access port cutout in the front panel and into the POM connector. The zone 2 airflow cools a pluggable optical module received in the POM connectors. Likewise for zone 3, 4, and 5 airflows.

Each zone of airflow receives ambient air directly from outside of network switch 100. As such, each zone of airflow provides the most effective cooling of the corresponding component because the air will not have been previously preheated by other electronic components of the network switch. Zone 1 airflow, for instance, can cool heat dissipator 484, which carries heat from switch chip 404, using ambient air. By comparison in conventional designs, the switch chip, being located within the enclosure, is cooled using air that has already picked up heat generated by the physical port electronics (e.g., pluggable optical module) and hence is less effective in removing heat generated by the switch chip.

Figure 6:
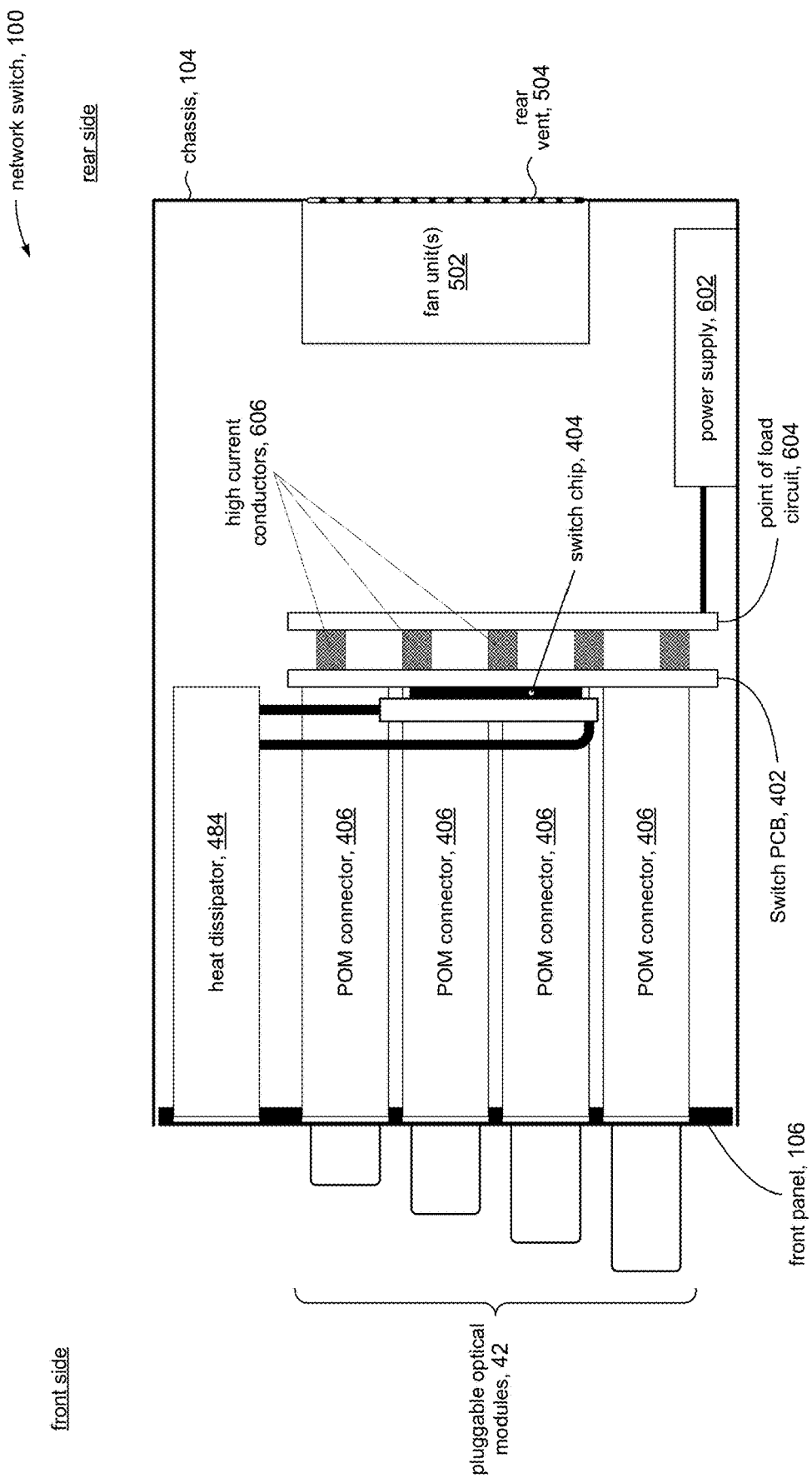
FIG. 6 is a schematic illustration of an example point of load power converter printed circuit board in accordance with the present disclosure.

FIG. 6 is a side view of network switch 100 showing additional details for SCA 400 taken along view line A-A shown in FIG. 4A. FIG. 6 also shows additional components in network switch 100. A power supply 602 converts AC power to a DC level (typically 12V DC) that is distributed to supply the various components in the network switch.

In some embodiments, SCA 400 includes a point of load (POL) circuit board 604 that receives 12V DC levels from power supply 602. POL circuit 604 can include voltage level converters to produce the DC voltage levels (e.g., 0.5V, 1.5V) required by switch chip 404, and DC voltage levels (e.g., 3.3V) for pluggable optics modules 42. POL circuit 604 can be mounted on Switch PCB 402. Power from the POL circuit can be provided to circuitry on the Switch PCB via high-current conductors 606 such as copper plugs.

In accordance with some embodiments, POL circuit 604 can include cutouts (not shown) that are substantially in alignment with airflow cutouts 410 formed through Switch PCB 402. The cutouts in POL circuit 604 prevent the blockage of airflow through the Switch PCB 402 (e.g., airflows 2-5, FIG. 5) so that airflow that cools the pluggable optical modules 42 can be exhausted out the rear side of chassis 104.

Figure 7:
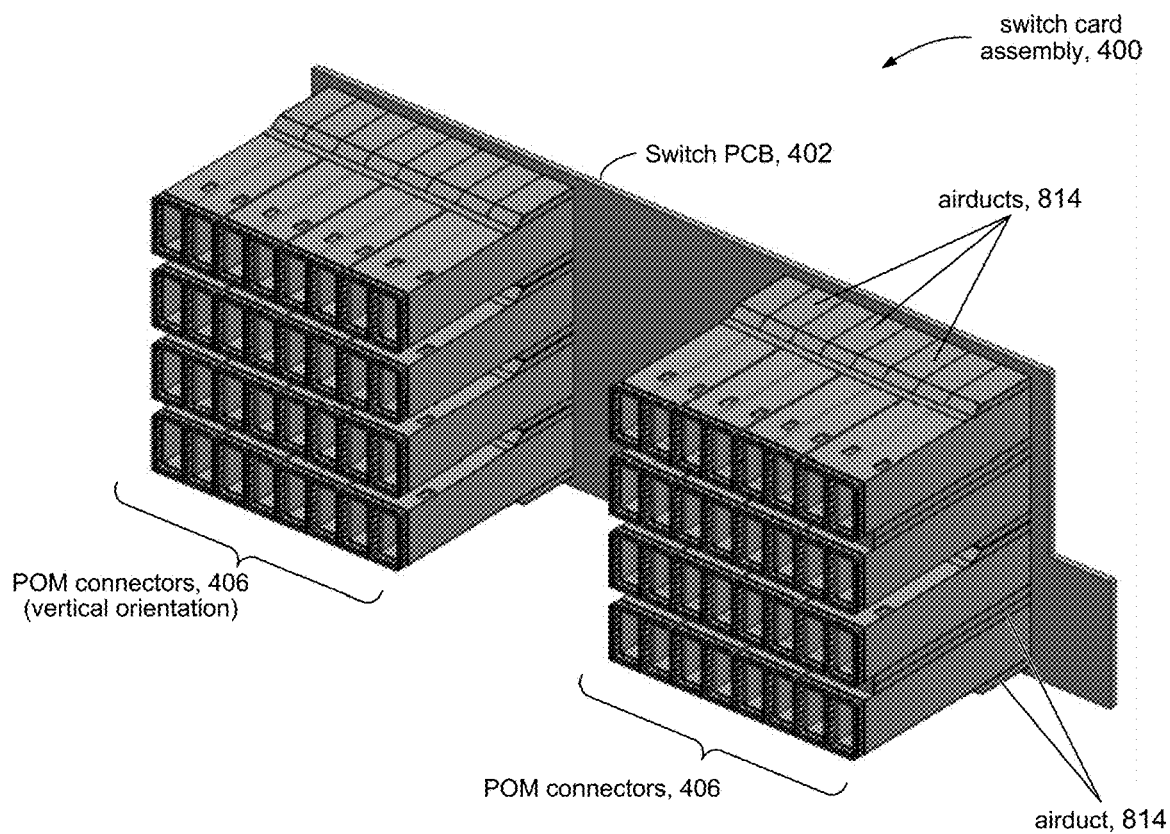
FIGS. 7 and 8 shows aspects of the example pluggable optics connectors in accordance with the present disclosure.

FIG. 7 is an isometric view of SCA 400, showing POM connectors 406 mounted on Switch PCB 402 and additional detail of the connectors. FIG. 7 illustrates two 4×8 arrays of POM connectors. It will be appreciated that in other embodiments, the POM connectors can be arranged in a single N×M array, or two or more N×M configuration of arrays where N and M can be the same or different among the arrays. In accordance with the present disclosure, each POM connector includes airducts 814 to facilitate cooling of a pluggable optical module installed in the POM connector.

Figure 8:
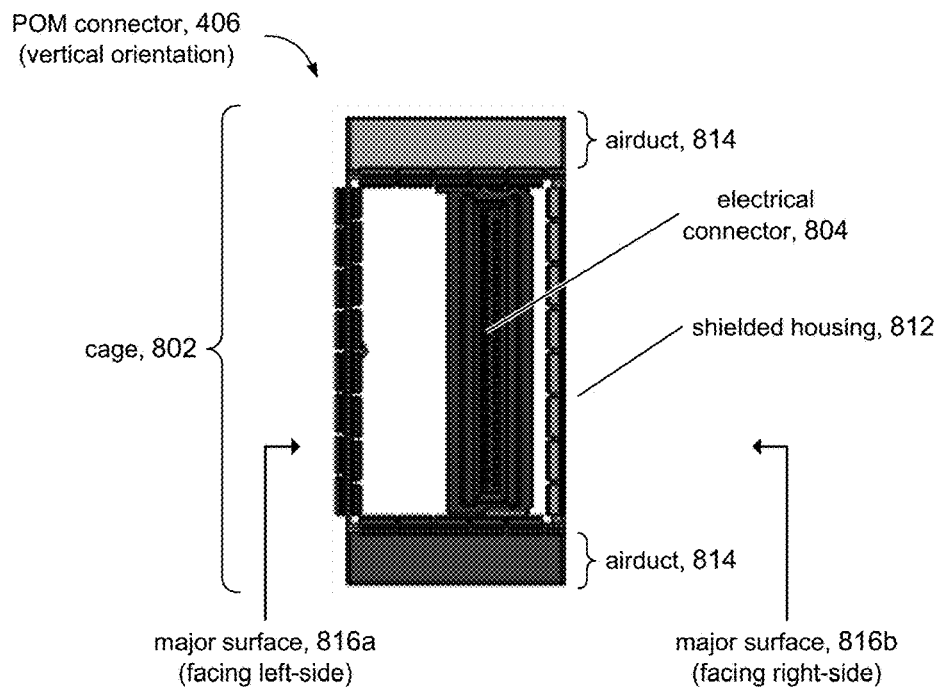

FIG. 8 is a face-on view of POM connector 406 in accordance with some embodiments. The POM connector can comprise a cage 802 and an electrical connector 804 disposed in cage 802. In some embodiments, cage 802 comprises an electromagnetically shielded housing 812 and airducts 814.

Figure 9:
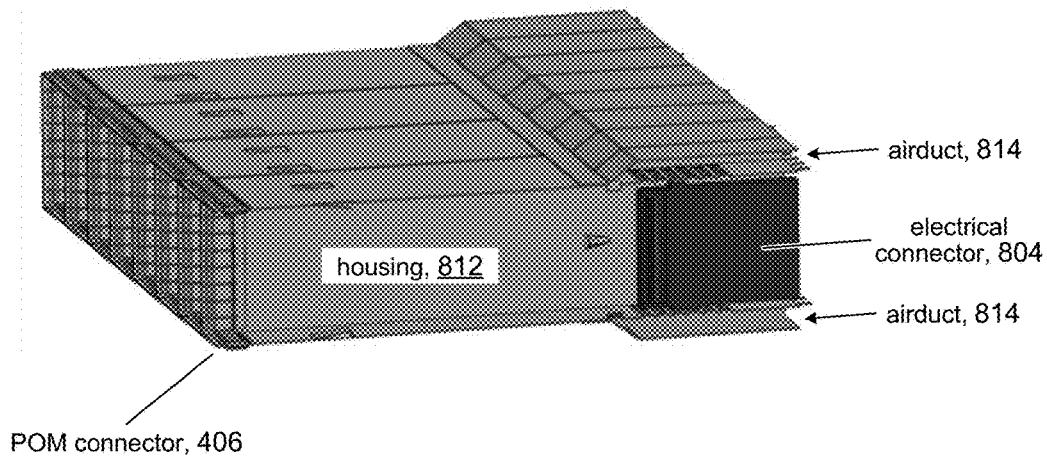
FIGS. 9 and 10 illustrate additional detail of the example pluggable optics connectors in accordance with the present disclosure.

FIG. 9 shows a cutaway view of POM connector 406, illustrating additional details in accordance with the present disclosure. The cutaway view exposes the interior of housing 812. Electrical connector 804 is disposed in the housing at the end of the housing where the POM connector mounts to Switch PCB 402.

Figure 10:
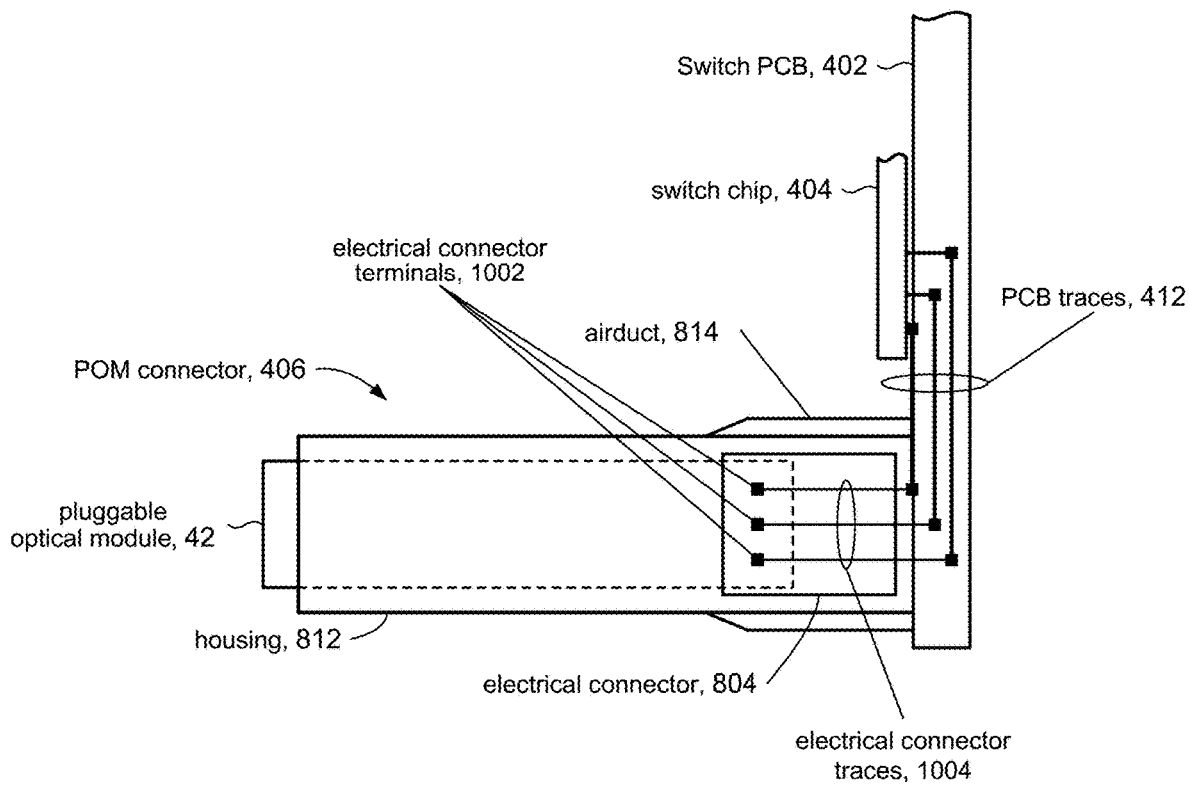

FIG. 10 is a schematic illustration that shows a pluggable optical module 42 received in POM connector 406. When pluggable optical module 42 is plugged into POM connector 406, the pluggable optical module is electrically coupled to the various electronic components carried on Switch PCB 402, including switch chip 404, power busses, ground lines, control lines, etc. In some embodiments, for example, electrical terminals (not shown) in pluggable optical module 42 can make contact with corresponding terminals 1002 on the electrical connector component 804 of POM connector 406. Traces 1004 formed on the electrical connector 804 electrically connect terminals 1002 to PCB traces 412 on Switch PCB 402. PCB traces 412, in turn, can connect to switch chip 404, power busses, ground lines, control lines, etc.

Figure 11:
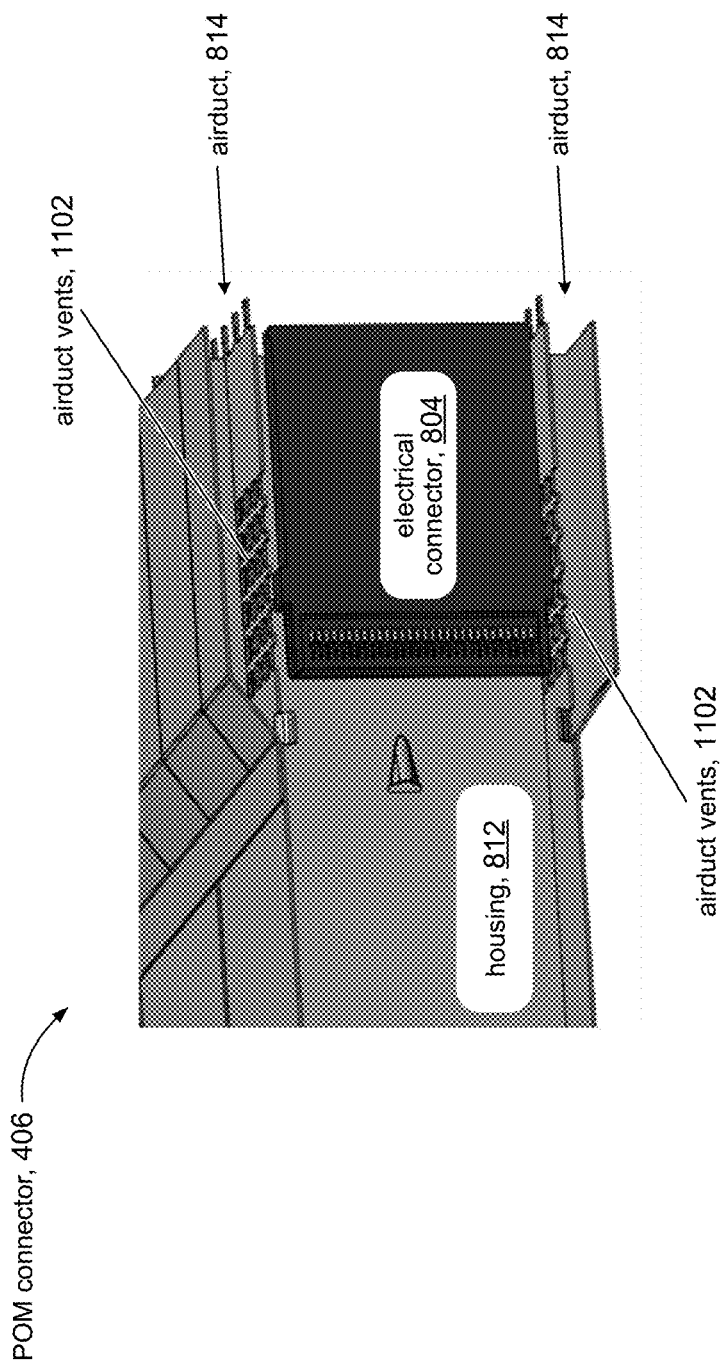
FIGS. 11 and 12 illustrate airflow through the example pluggable optics connectors in accordance with the present disclosure.
Figure 12:
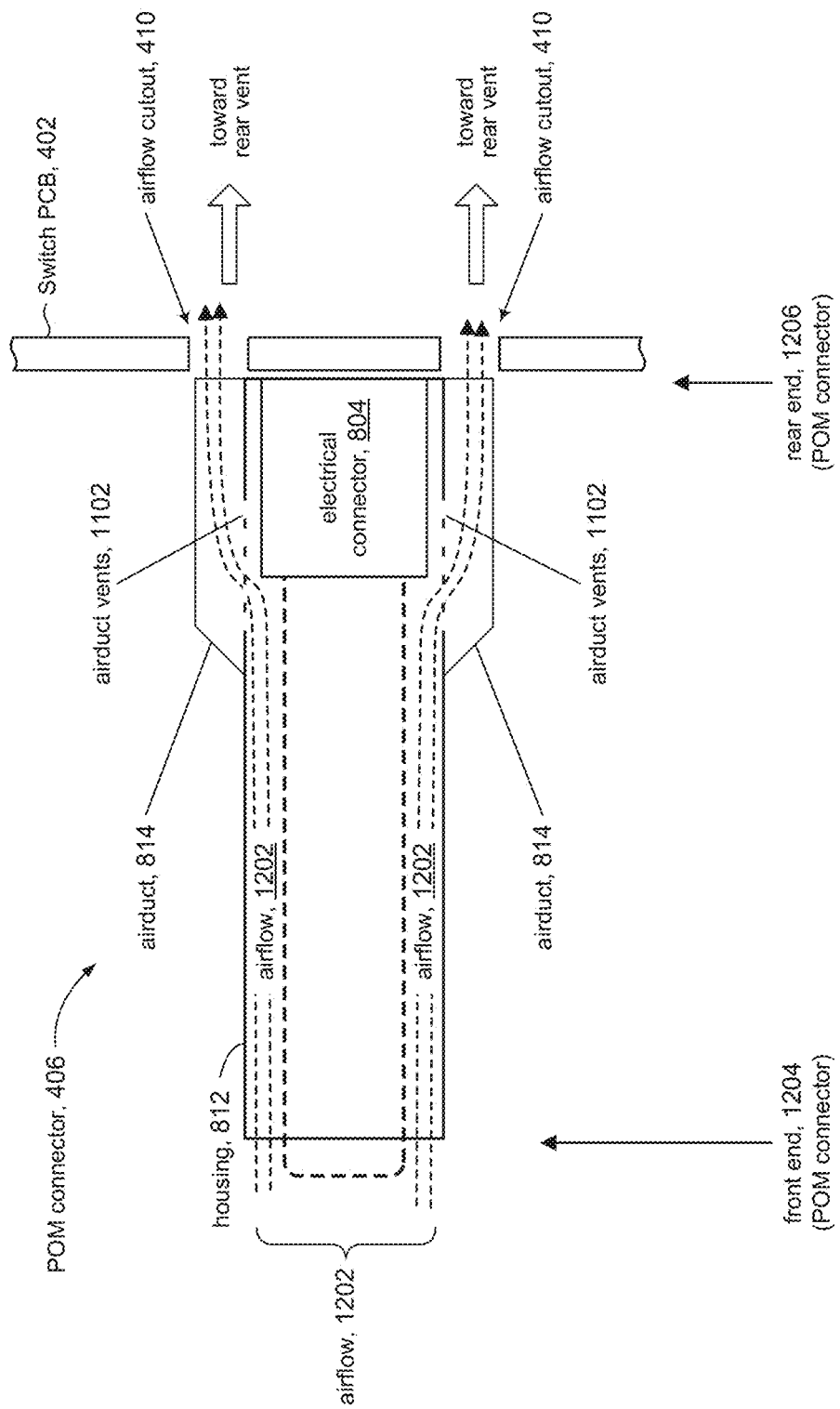

FIGS. 11 and 12 illustrate airducts 814 of POM connectors 406 in more detail. FIG. 11 is a magnified portion of the cutaway view shown in FIG. 9. In some embodiments, housing 812 includes airduct vents 1102 to provide an opening from the housing into airducts 814. Referring to FIG. 12, airflow channels (paths) 1202 in POM connector 406 are defined by housing 812, airducts 814, and vents 1102, where air can flow from the front end 1204 of the connector to the rear end 1206 of the connector. The airflow enters housing 812, continues along the length of the housing, splits into streams that enter airducts 814 via the airduct vents 1102, exits the air ducts, and continues through airflow cutouts 410 in the Switch PCB 402 which are substantially aligned with the airducts. A pluggable optical module (not shown) received in the housing can be cooled by airflows along channels 1202 passing across the pluggable optical module.

Figure 13:
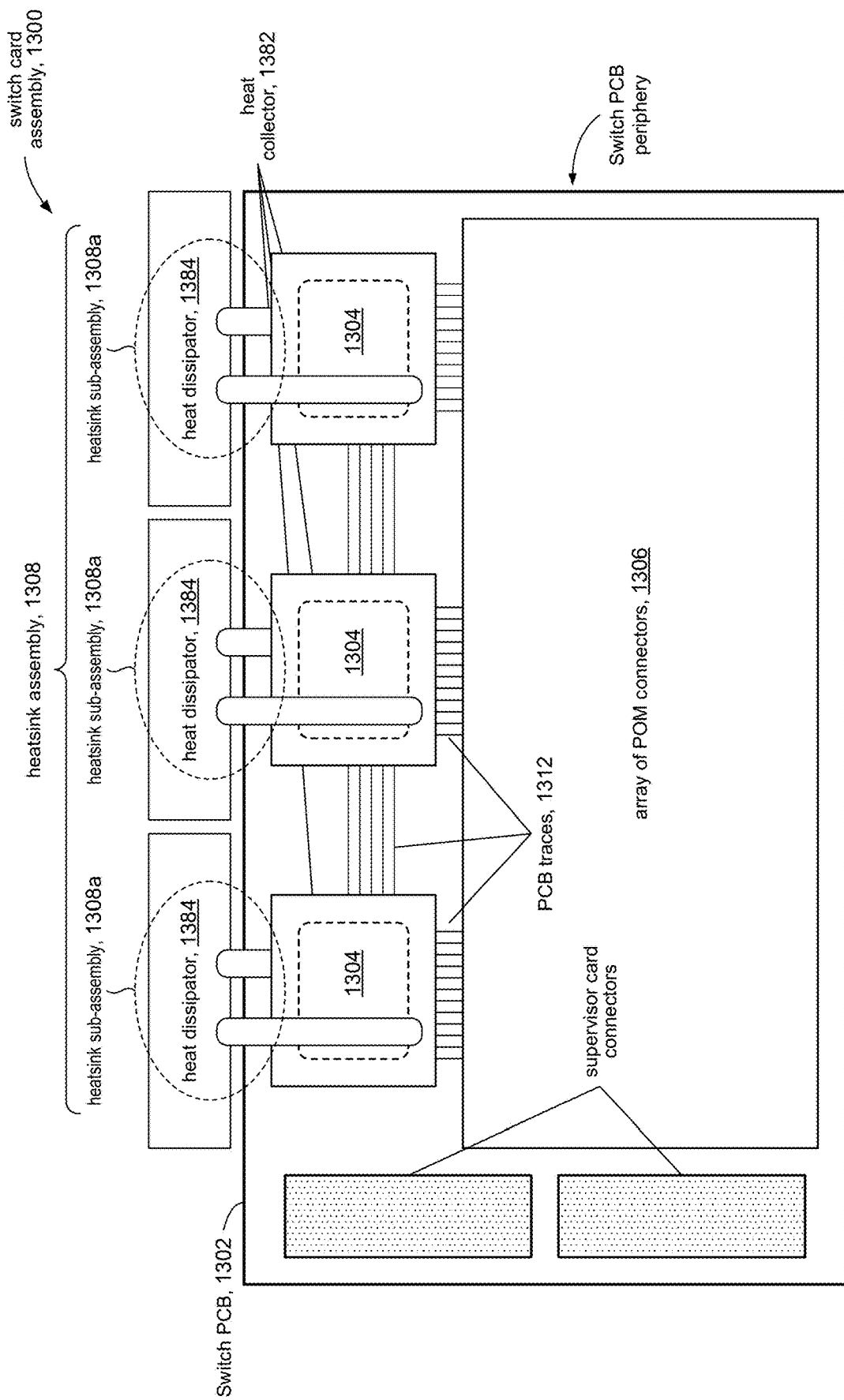
FIG. 13 is a schematic illustration of an embodiment in accordance with the present disclosure that uses multiple switch chips.

FIG. 13 represents an embodiment in accordance with the present disclosure that comprises multiple switch chips. In some embodiments, SCA 1300 carries multiple switch chips 1304. Although the figure shows a three-chip configuration, some embodiments may comprise two switch chips and still other embodiments may comprise more than three switch chips. The outlines of switch chips 1304 are shown because they lie behind respective heat collectors 1382. It will be appreciated that Switch PCB 1302 can carry additional circuitry, for example, to support switch chips 1304.

SCA 1300 further comprises an array of POM connectors 1306, where each POM connector is mounted so that its long axis is perpendicular to the plane of the Switch PCB; see, for example, FIG. 4B. The POM connector array can contain a suitable number of POM connectors, depending on the switching capacity of the switch chips. Merely to illustrate this point, for example, the array 1306 may contain 128 POM connectors arranged in an 8 row×16 column pattern.

SCA 1300 further comprises PCB traces 1312 to create electrical paths between the POM connectors and switch chips 1304. When a pluggable optical module (e.g., 42) is received in one of the POM connectors, the pluggable optical module can be electrically coupled to the switch chips by way of the PCB traces. As noted above, PCB traces 1312 comprise traces printed on or otherwise formed on top, bottom, and/or among conductive layers of a multi-layered printed circuit board.

SCA 1300 further comprises heatsink assembly 1308 comprising several heatsink sub-assemblies 1308a, 1308b, 1308c, one heatsink sub-assembly for each switch chip. Each heatsink sub-assembly comprises a respective heat collector 1382 in thermal contact with a respective switch chip 1304 and connected to a respective heat dissipator 1384 to dissipate heat generated by that switch chip. In accordance with the present disclosure, heat dissipators 1384 can be arranged at or about the periphery of Switch PCB 1302 (see also, FIG. 4A). Both the POM connectors and the heat dissipators are exposed through separate openings in the front panel of a network switch when the SCA 1300 is installed in the network switch. When a flow of intake air is created (e.g., by operation of fans in the network switch) the intake airflow will include zones of airflow that flow into the heat dissipators and separate zones of airflow that flow into the POM connectors.

This arrangement improves cooling of switch chips 1304 and pluggable optics modules received in POM connectors 1306 by segregating the airflow between the heat dissipators and the pluggable optics modules. The optics modules can be cooled with air flowing through POM connectors 1306 and cutouts (e.g., FIG. 4C) in Switch PCB 1302 to the air plenum behind the SCA (e.g., FIG. 5). Switch chips 1304 can be cooled by heat collectors 1382 attached to respective switch chips 1304, which transfer heat produced by the switch chips to heat dissipators 1384 mounted at the periphery (e.g., above, below, to the sides) of Switch PCB 1302. This arrangement supplies the heat dissipators with air at ambient temperature which significantly improves the cooling performance for the switch chip as compared to conventional designs.

It will be appreciated that persons of ordinary skill will understand the cooling of the switch chips can be accomplished by any suitable cooling mechanism. For example, although not shown, in some embodiments the cooling of the switch chips on the switch card assembly can be performed with cold-plates attached to the switch chips that use a circulating fluid to transport the heat from the switch chips to an external heat exchanger, either to air or chilled water.

The discussion will now turn to another embodiment in accordance with the present disclosure. As noted above, the foregoing embodiments show the POM connectors 406 in a vertical orientation, see for instance POM connectors 406 mounted on switch assembly card 400 in FIG. 7. The vertical orientation of the connector is more clearly illustrated in the detailed view of a POM connector in FIG. 8, for example. In this orientation, the major surfaces 816a, 816b, for instance, face the left- and right-side edges of the Switch PCB 402 (FIG. 4A), respectively.

Figure 14:
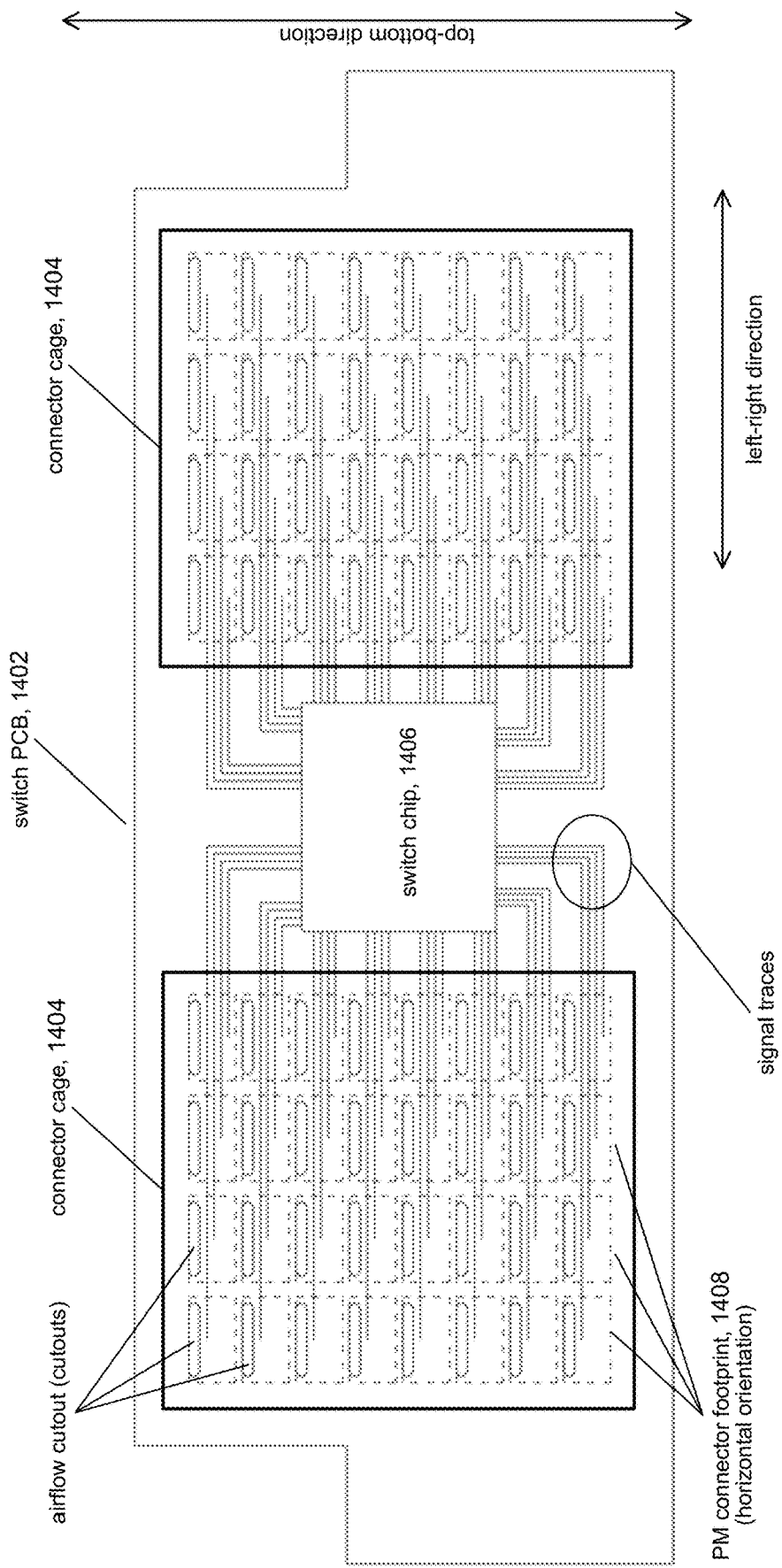
FIG. 14 illustrates a switch printed circuit board in accordance with the present disclosure.

FIG. 14 shows an example of a horizontal connector configuration in accordance with some embodiments. Switch PCB 1402 includes two connector cages 1404 mounted on the left and right side of switch chip 1406. FIG. 14 shows pluggable module (PM) connector footprints 1408 (shown in dashed lines) representing PM connectors arranged in a horizontal orientation. The present disclosure is applicable to both optical and non-optical ("copper") pluggable modules.

Figure 15:
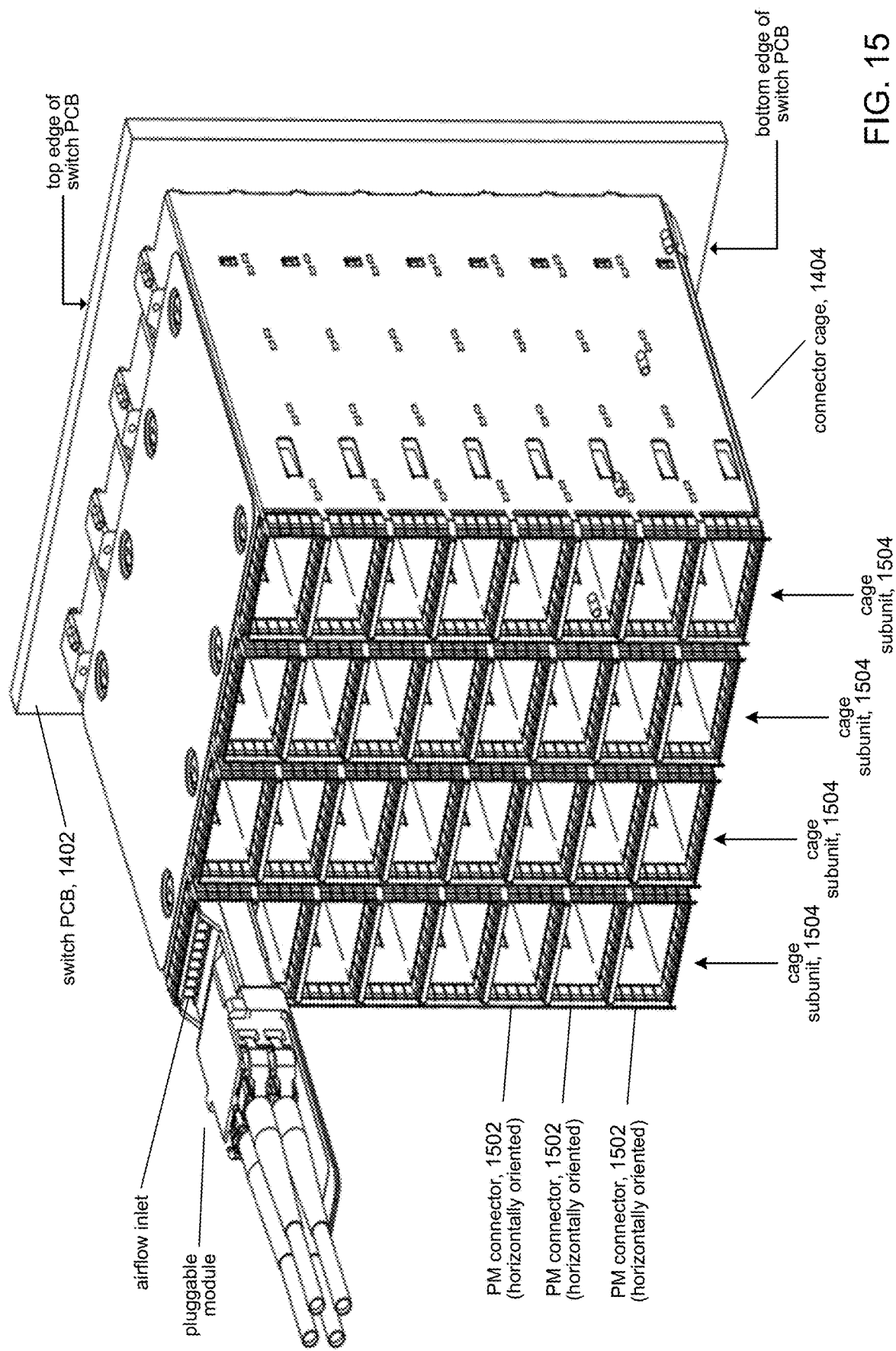
FIG. 15 illustrates a connector cage in accordance with the present disclosure.

FIG. 15 shows details of connector cage 1402, comprising an array of horizontally-oriented PM connectors 1502. A pluggable module (PM) is shown inserted in one of the PM connectors. In some embodiments, the connector cage 1404 can be a single cage unit that houses the array of PM connectors; e.g., connector cage 1404 can contain an 8×4 array of PM connectors. In other embodiments, the connector cage 1404 can comprise multiple cage subunits. FIG. 15, for example, shows that in some embodiments connector cage 1404 can comprise four cage subunits 1504, where each cage subunit contains an 8×1 column of PM connectors (e.g., cage 2602, FIG. 26). It will be appreciated that other configurations are possible.

Figure 16:
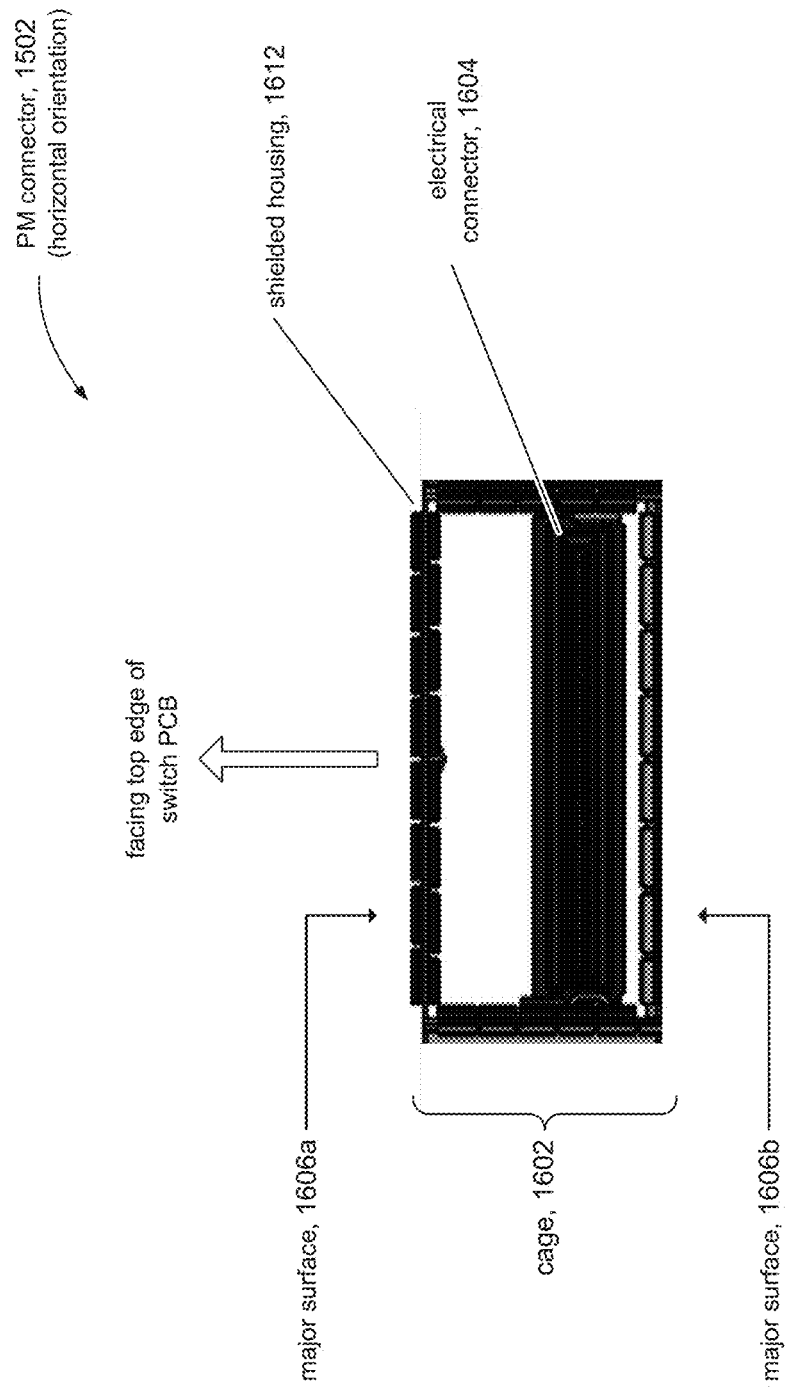
FIG. 16 shows a pluggable module connector in accordance with the present disclosure.

FIG. 16 shows details of PM connector 1502, including a cage 1602 and an electrical connector 1604 disposed in the cage. In some embodiments, cage 1602 can comprise an electromagnetically shielded housing 1612. Major surfaces 1606a, 1606b are identified. In some embodiments, the PM connector can be oriented horizontally relative to the switch PCB 1402.

Figure 17:
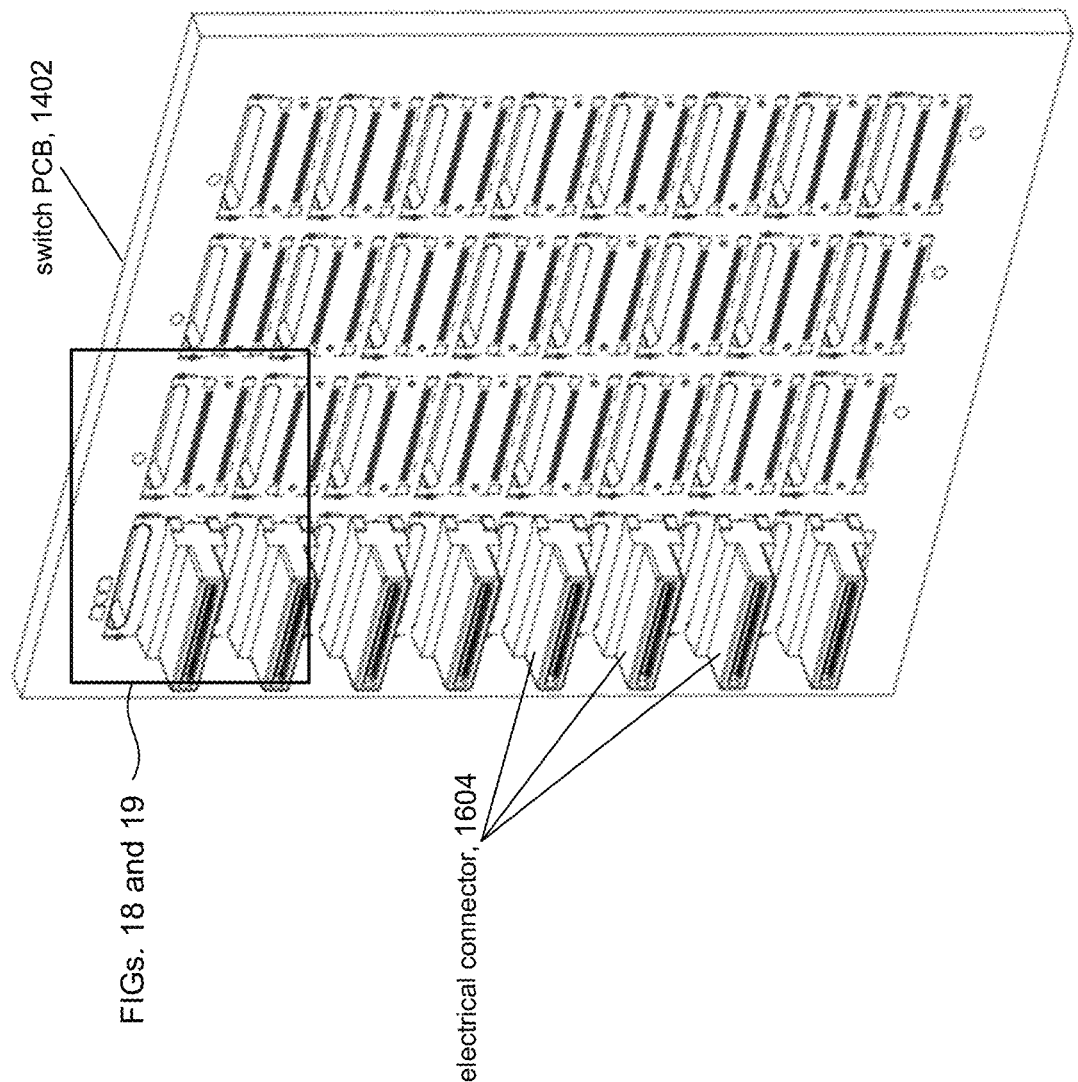
FIG. 17 illustrates a switch printed circuit board in accordance with the present disclosure.

FIG. 17 shows a portion of the switch PCB 1402, highlighting the electrical connector component 1604 of the PM connector 1502, absent the shielded housing 1612. A portion of the switch PCB identified in FIG. 17 is described in FIGS. 18A and 18B.

Figure 18A:
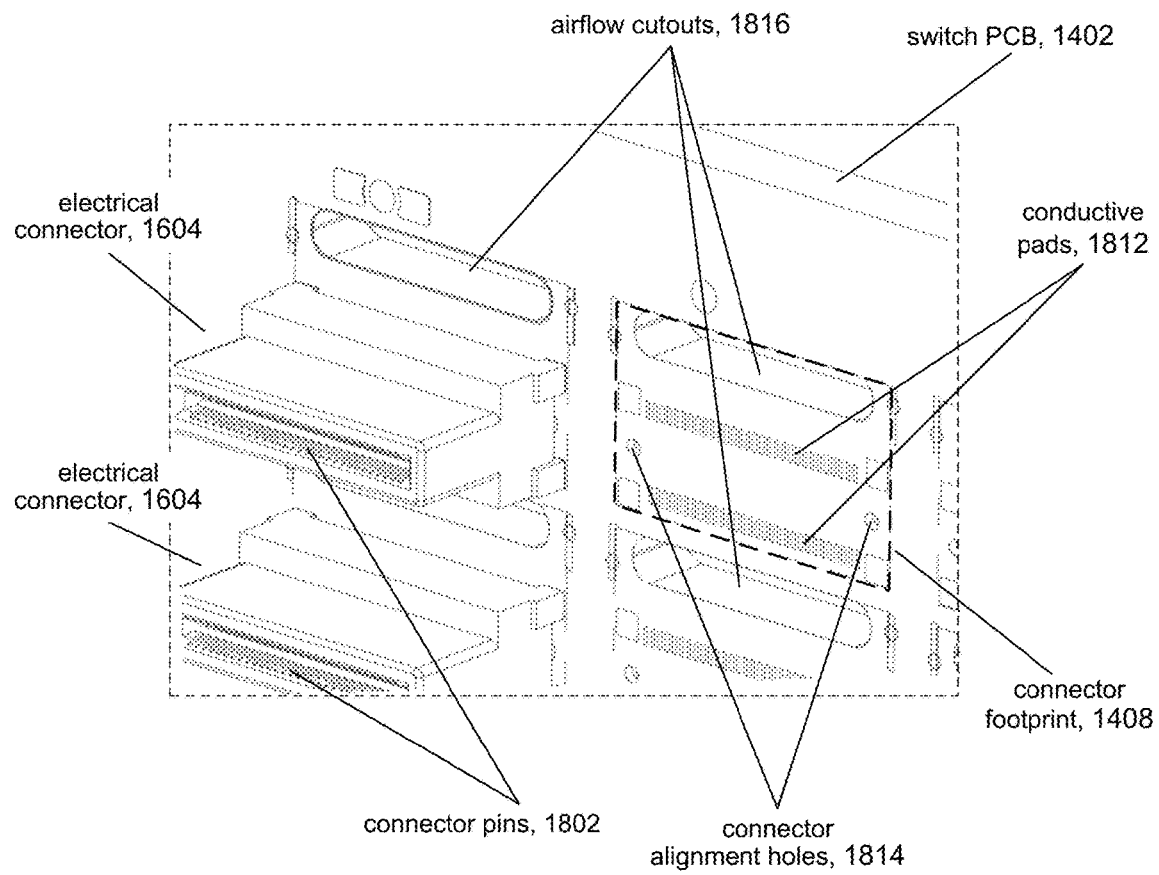
FIGS. 18A and 18B show details of an electrical connector in accordance with the present disclosure.
Figure 18B:
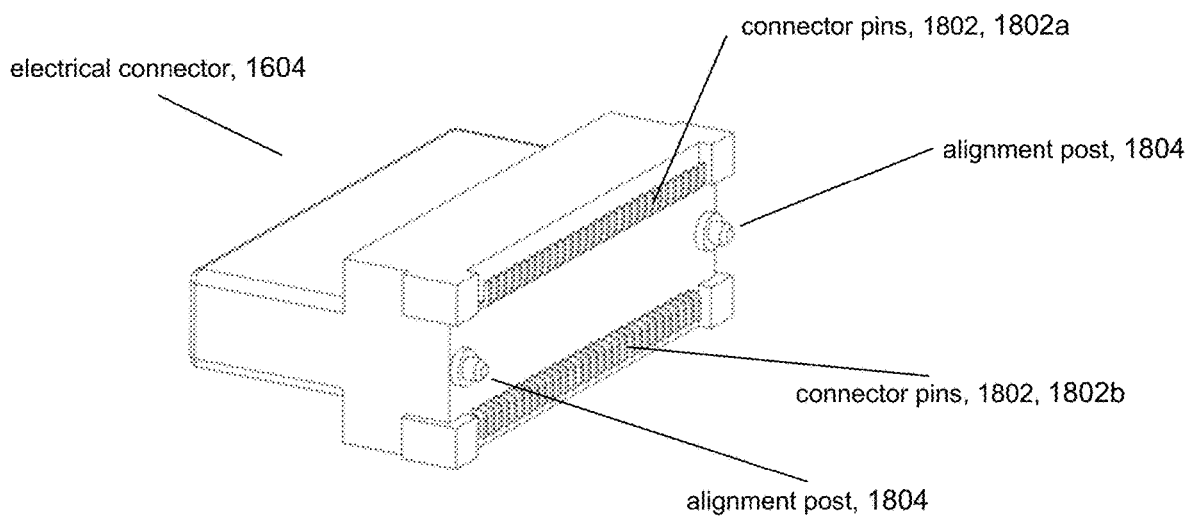

FIGS. 18A and 18B show details of electrical connector 1604. In some embodiments, electrical connector 1604 includes electrical connector pins 1802. The pins extend from the front of the electrical connectors (FIG. 18A) to the rear of the electrical connector (FIG. 18B). The pins are arranged in a first row (line) of pins 1802a and a second row (line) of pins 1802b. The rows (lines) of pins match up and come into contact with corresponding rows (lines) of conductive pads 1812 on the switch PCB 1402 when the connectors are mounted on the switch PCB.

It can be appreciated that the pin and pad pitch tolerances can be tight. To ensure proper alignment between the pins 1802 and the pads 1812, the electrical connector can have alignment posts 1804, which align and mate to corresponding connector alignment holes 1814 formed on the switch PCB 1402. In some embodiments, the alignment holes 1814 can be blind holes rather than through holes. The blind holes do not break through to the other side of the PCB board. As explained below, this allows signal traces to be placed beneath the blind holes.

FIG. 18A shows the connector footprint 1408, which includes an area for the electrical connector 1604. In accordance with the present disclosure, airflow cutouts 1816 are formed through the switch PCB inside the footprint 1408 to allow for ambient air to enter through the airflow inlet of a pluggable module (FIG. 15), absorb heat generated by the pluggable module, and exit out of the rear of the switch PCB across the airflow cutout. In accordance with the present disclosure, the airflow cutout 1816 can be elongate in shape, having a long axis (FIG. 19) that is parallel to the rows of conductive pads 1812 and to the corresponding rows of connector pins 1802a, 1802b of electrical connector 1604.

Figure 19:
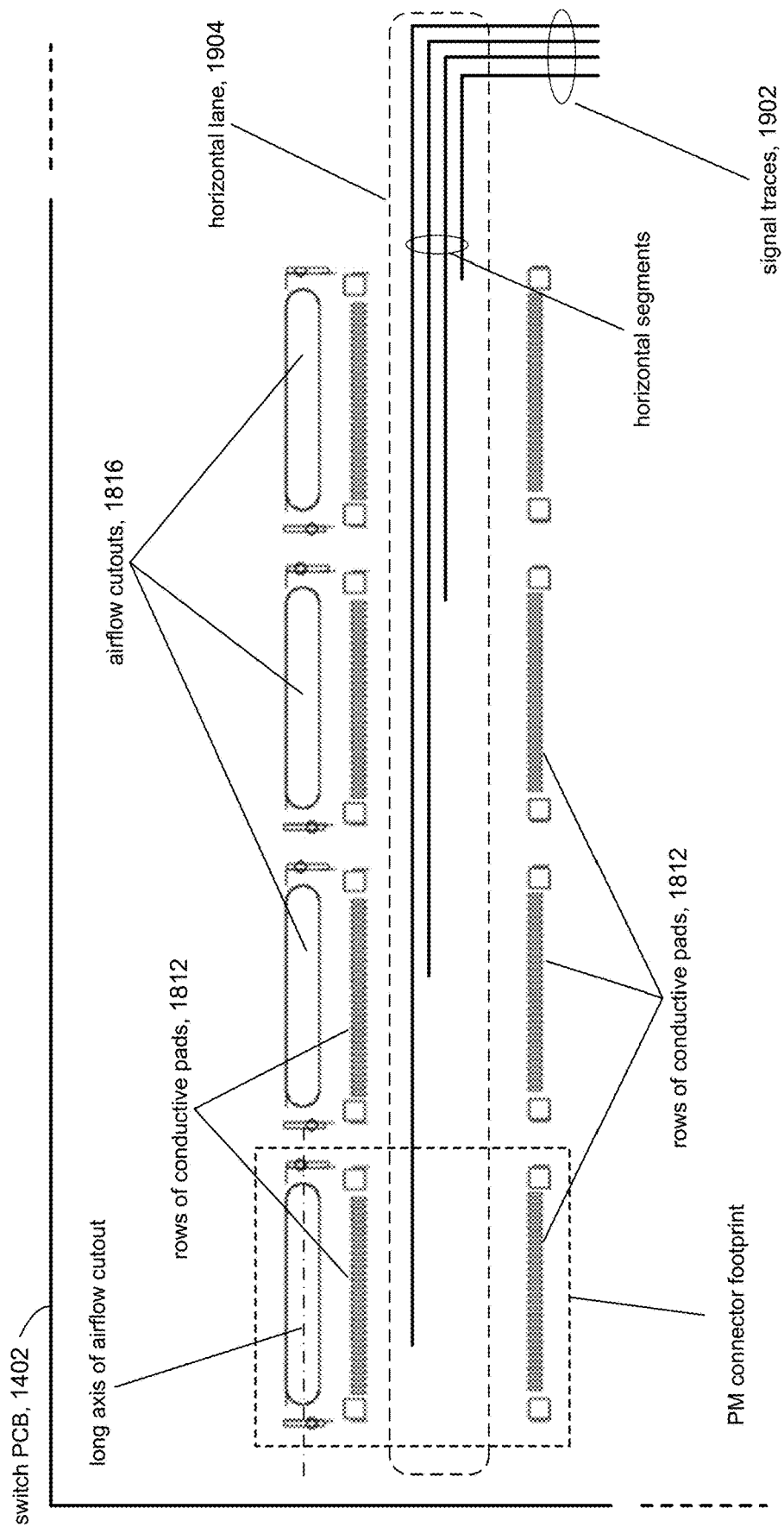
FIG. 19 show details of a switch printed circuit board in accordance with the present disclosure.

Referring to FIG. 19, it can be seen that the airflow cutouts 1816 and the rows of corresponding conductive pads 1812 both lie parallel to horizontal segments of the signal traces 1902. The horizontally oriented rows of conductive pads 1812 create a horizontal "lane" 1904 in an area of the switch PCB that cross a periphery of the electrical connectors where signal traces within the switch PCB can run parallel relative to the rows of horizontal conductive pads. It is noted that in a vertical configuration, where the electrical connectors are vertically oriented (e.g., as indicated by PM connector outline 406, FIG. 4C), the conductive pads would be arranged as vertical columns rather than horizontal rows. Signal traces would run perpendicularly relative to the columns of conductive pads.

Figure 20A:
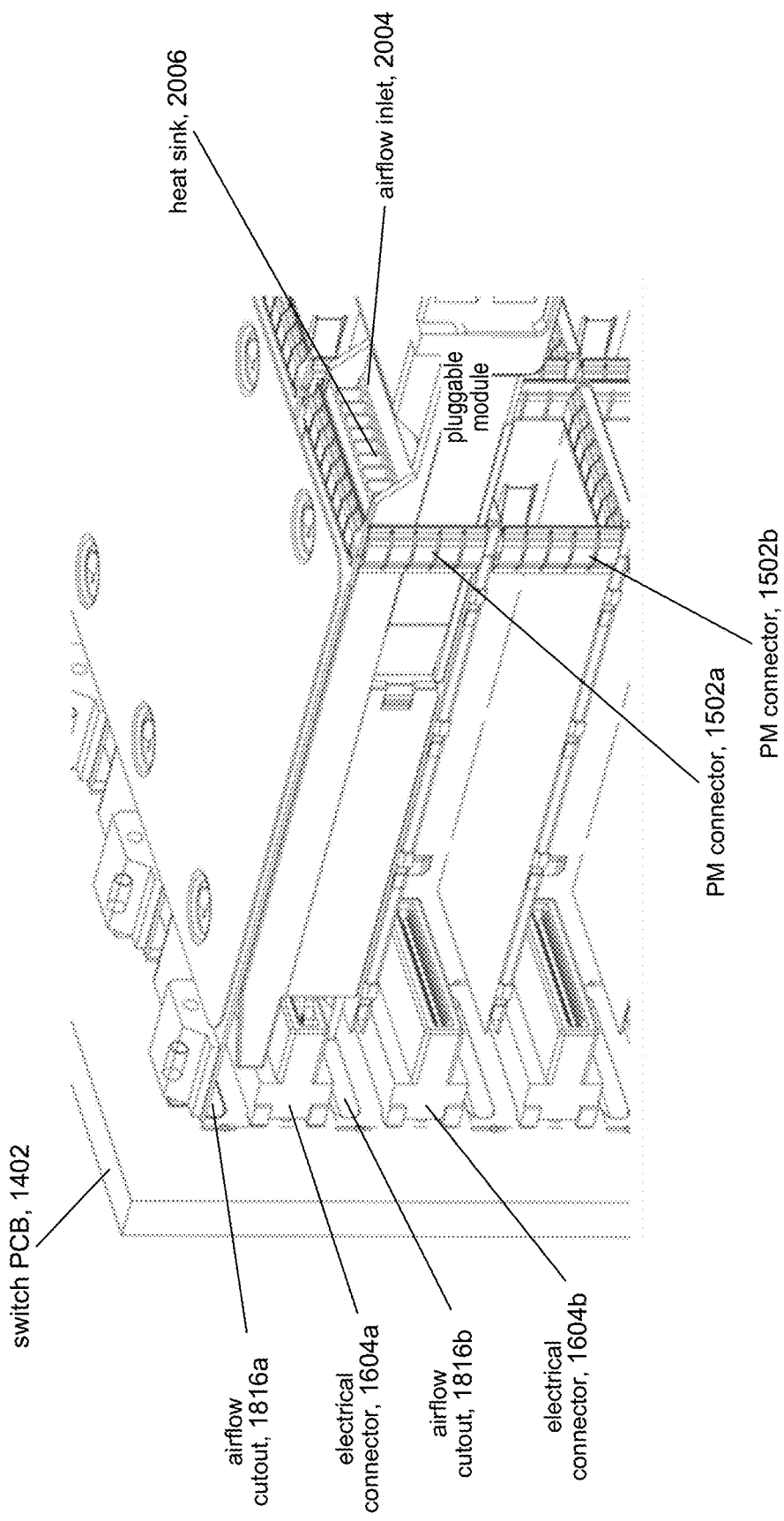
FIGS. 20A, 20B, and 20C are various views showing POM connectors in accordance with the present disclosure.
Figure 20B:
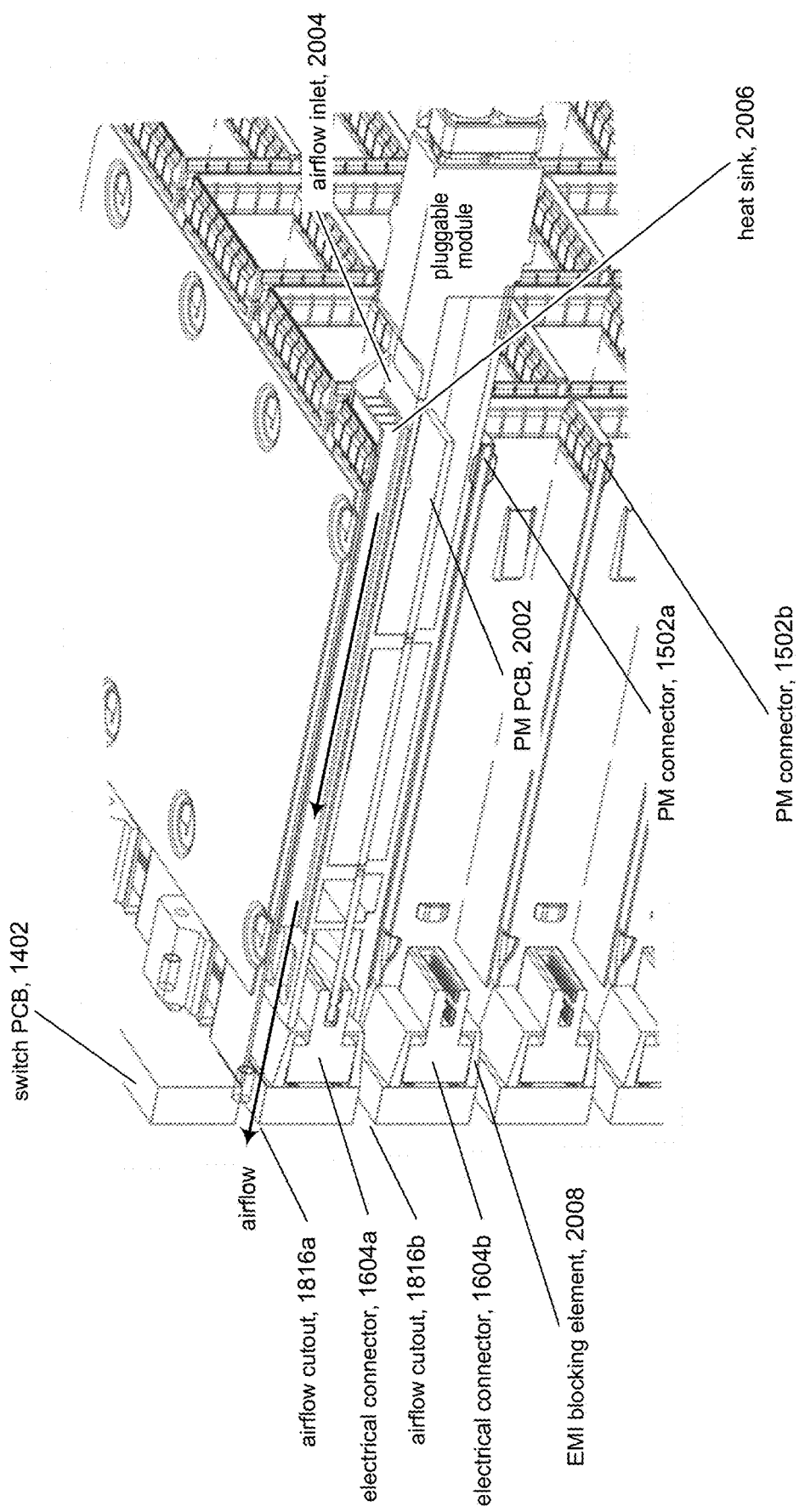
Figure 20C:
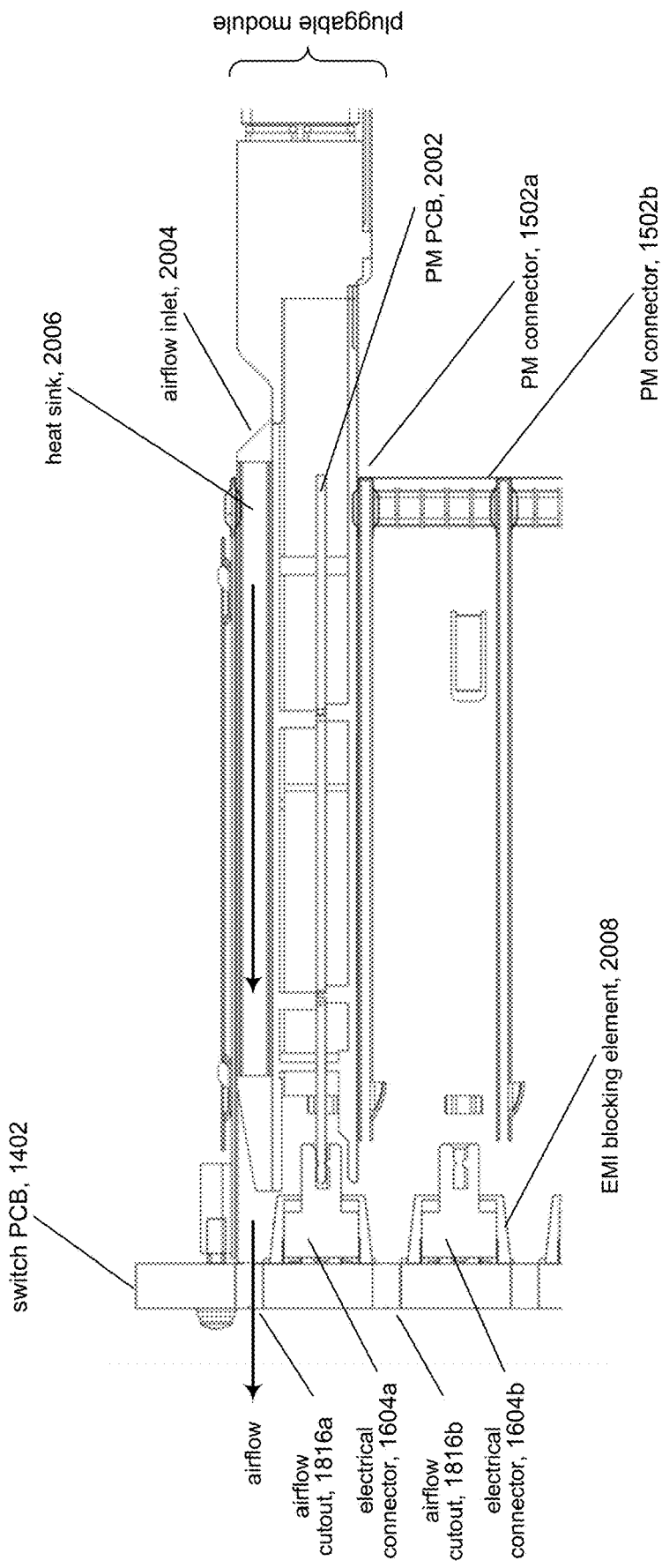

FIG. 20A is a perspective view showing PM connectors 1502a, 1502b. A pluggable module received in PM connector 1502a. FIGS. 20B and 20C are cutaway views through PM connectors 1502a, 1502b. FIG. 20B is a perspective view and FIG. 20C is a side view. The cutaway views show respective electrical connector components 1604a, 1604b of PM connectors 1502a, 1502b, and respective airflow cutouts 1816a, 1816b. PM PCB component 2002 of the pluggable module is received or otherwise inserted in electrical connector component 1604a of PM connector 1502a.

The pluggable module includes a heat sink 2006 that is in thermal contact with electrical and optical (optoelectronic) components on PM PCB 2002. Airflow inlet 2004 provides an inlet for ambient air to enter the pluggable module, flow across the surfaces of heat sink 2006, and exit the pluggable module via airflow cutout 1816a. Heat generated by the optoelectronics during operation of the pluggable module transfers to the heat sink. Ambient air is heated as it passes across the heat sink and is exhausted through the airflow cutout, thus cooling the optoelectronics of the pluggable module. In accordance with the present disclosure, the airflow cutout 1816a is in line with air passages in the heat sink, thus providing an unobscured straight-line flow path between the airflow inlet 2004 and the airflow cutout.

FIGS. 20B and 20C show that in some embodiments, the electrical connector (e.g., 1604b) can be housed in an electromagnetic interference (EMI) blocking element 2008. EMI emissions (radiation) produced during operation of pluggable modules received in the PM connectors can affect performance of the switch. EMI emissions can radiate from the electrical connector, surface traces, etc. Accordingly, in some embodiments, suitable EMI blocking elements, such as EMI absorbers and EMI shielding, can be employed. The discussion will now turn to this aspect of the present disclosure.

Figure 21:
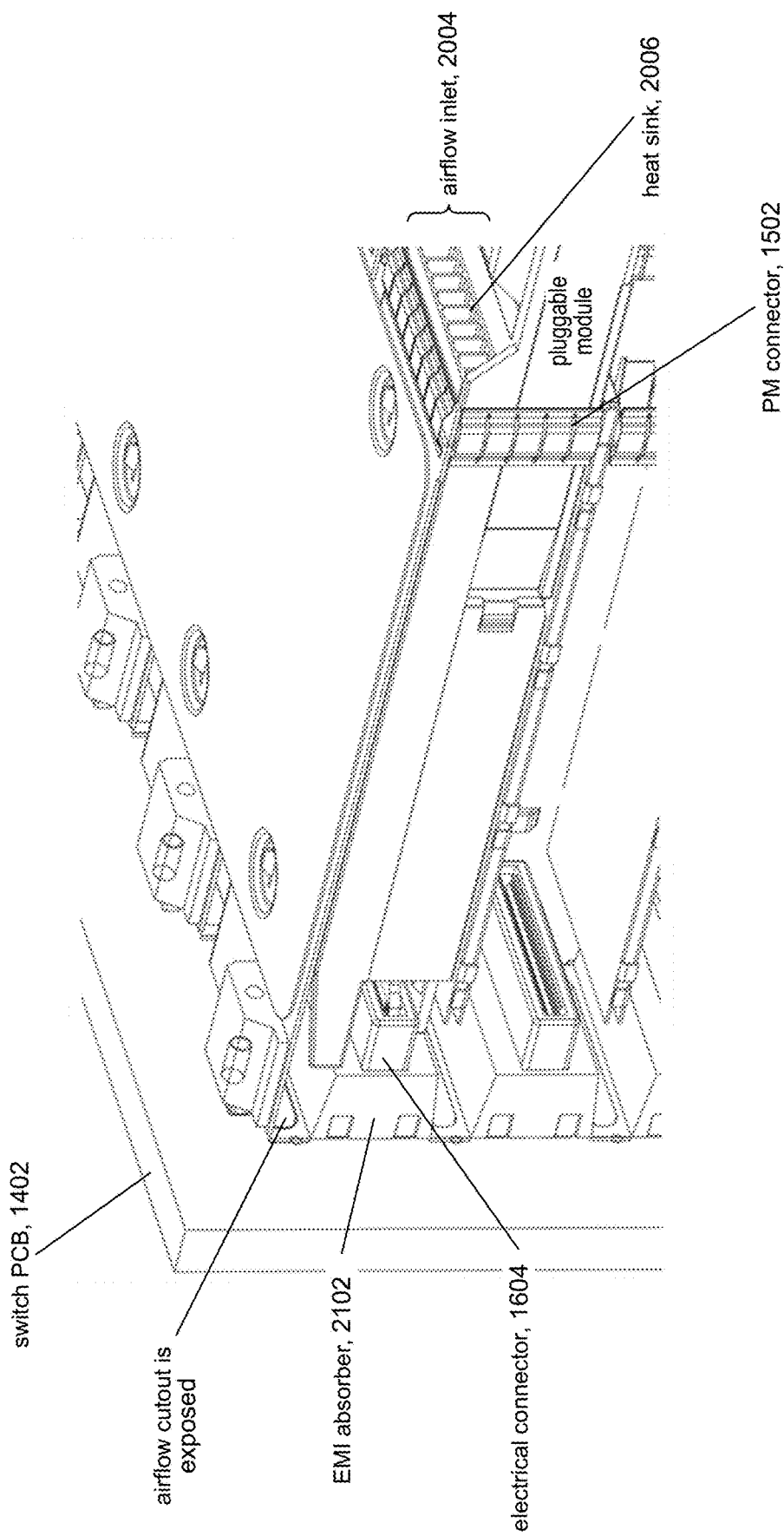
FIG. 21 shows an example of an EMI blocking/absorbing element in accordance with the present disclosure.

FIG. 21 shows an example of an EMI blocking element. In some embodiments, for example, electrical connector 1604 can be housed in an EMI absorber 2102, formed of material that can absorb EMI radiation. The embodiment of FIG. 21 shows the EMI absorber houses just the electrical connector, leaving the airflow cutout exposed.

FIGS. 22A, 22b, and 22C illustrate another example of an EMI blocking element in accordance with some embodiments. FIG. 22A shows EMI absorber 2202 houses the electrical connector 1604 and extends across the airflow cutout. FIGS. 22B and 22C show that the portion of EMI absorber 2202 that extends across the airflow cutout can be perforated to maintain a passageway for airflow. Although figures show hexagonal perforations, the shape of the openings can be other than a hexagon.

FIGS. 23A, 23*b*, and 23C illustrate another example of an EMI blocking element in accordance with some embodiments. FIG. 23A shows EMI shielding 2302 attached (e.g., clipped on, friction fit, etc.) to the electrical connector 1604 to extend across the airflow cutout. EMI shielding 2302 can be electrically conductive and grounded (e.g., to a ground trace) to mitigate EMI emissions. FIGS. 23B and 23C show that EMI shielding 2302 can be metallic and shaped to minimize obstruction of airflow cutout 1816.

Figure 24A:
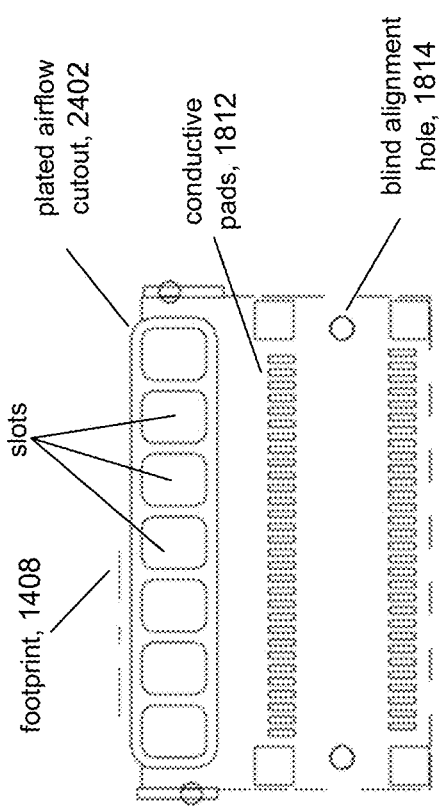
FIGS. 24A and 24B show an example of an EMI blocking/absorbing element in accordance with the present disclosure.
Figure 24B:
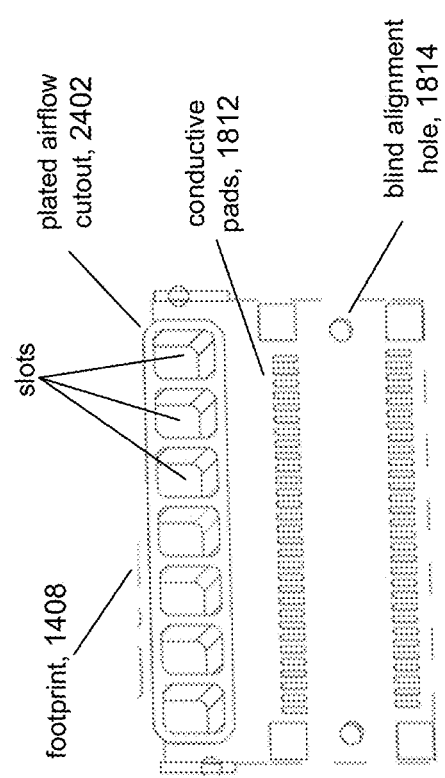

FIGS. 24A and 24B illustrate another example of an EMI blocking element in accordance with some embodiments. FIGS. 24A and 24B show footprint 1408 for a PM connector, illustrating an airflow cutout 2402 that is slotted and plated with a conductive coating. The plated coating can be grounded to provide EMI shielding within the airflow cutout.

Figure 25A:
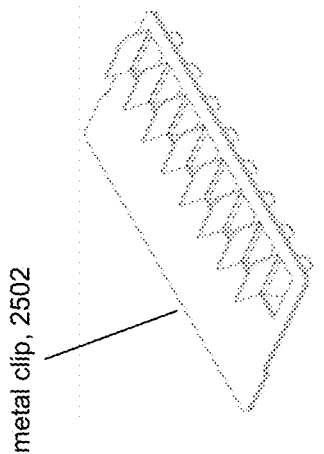
FIGS. 25A and 25B show an example of an EMI blocking/absorbing element in accordance with the present disclosure.
Figure 25B:
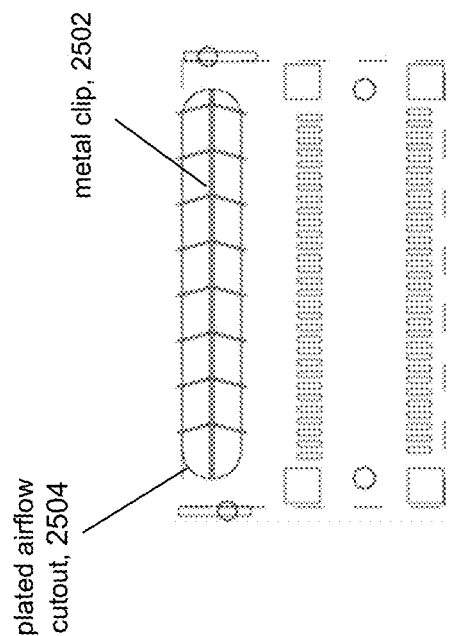

FIGS. 25A and 25B illustrate another example of an EMI blocking element in accordance with some embodiments. Instead of forming slots in the airflow cutout, the airflow cutout can be plated with conductive material and a slotted metallic clip can be inserted. FIG. 25A shows an example of such a metal clip 2502, and FIG. 25B shows the metal clip inserted in a plated airflow cutout 2504.

Figure 26:
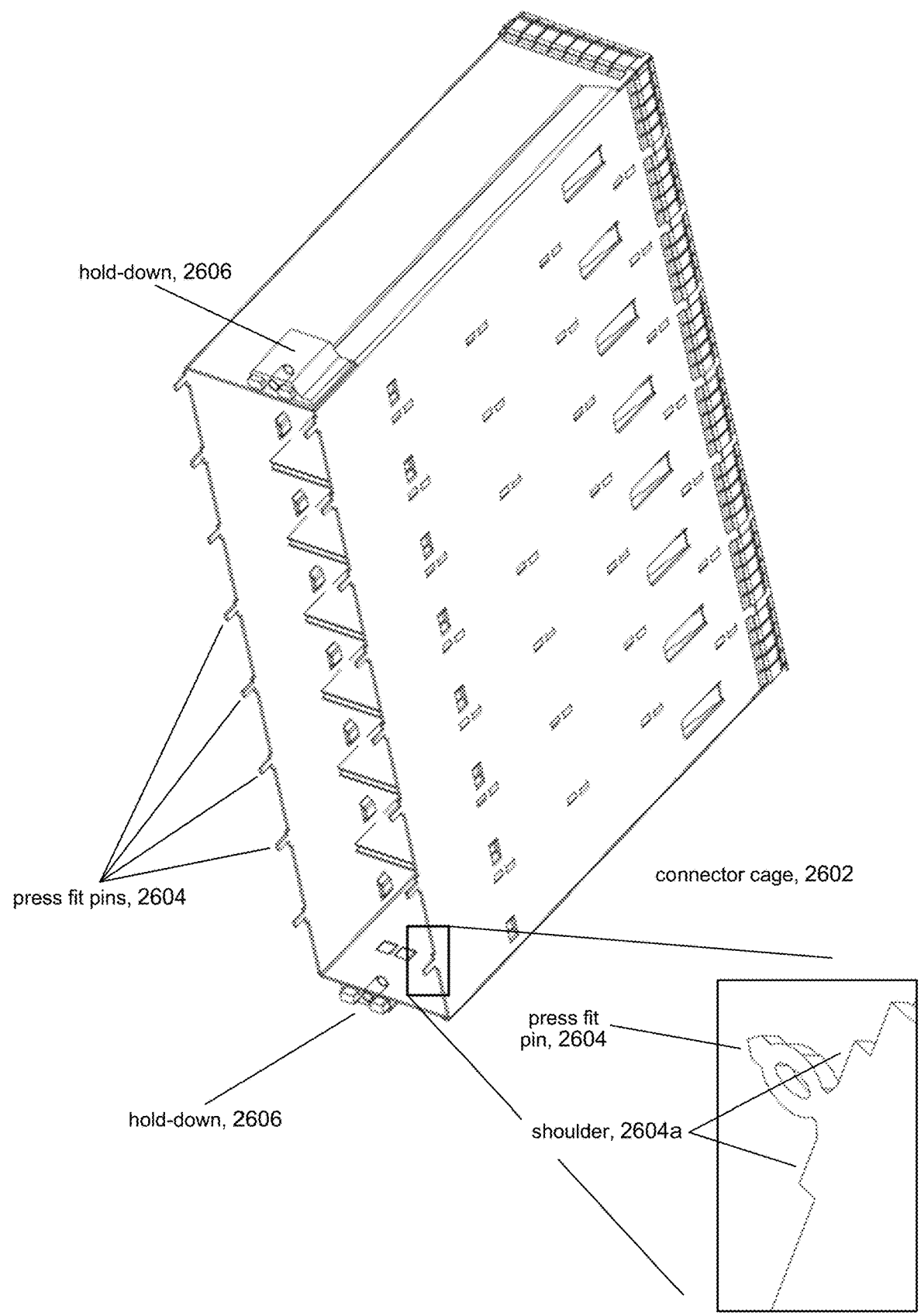
FIG. 26 shows a connector cage in accordance with the present disclosure.

The discussion will now turn to a description of a connector cage (FIG. 26) and PCB (FIG. 27) in accordance with some embodiments. FIG. 26 shows an example of an 8×1 connector cage 2602, illustrating mechanical elements in accordance with the present disclosure. Connector cage 2602 can include press fit pins 2604 and hold-down mechanisms (features) 2606. The inset shows that press fit pin 2604 includes a shoulder portion 2604*a*. A hold-down mechanism 2606 can be provided on the top side of the connector cage and on the bottom side of the connector cage.

Figure 27:
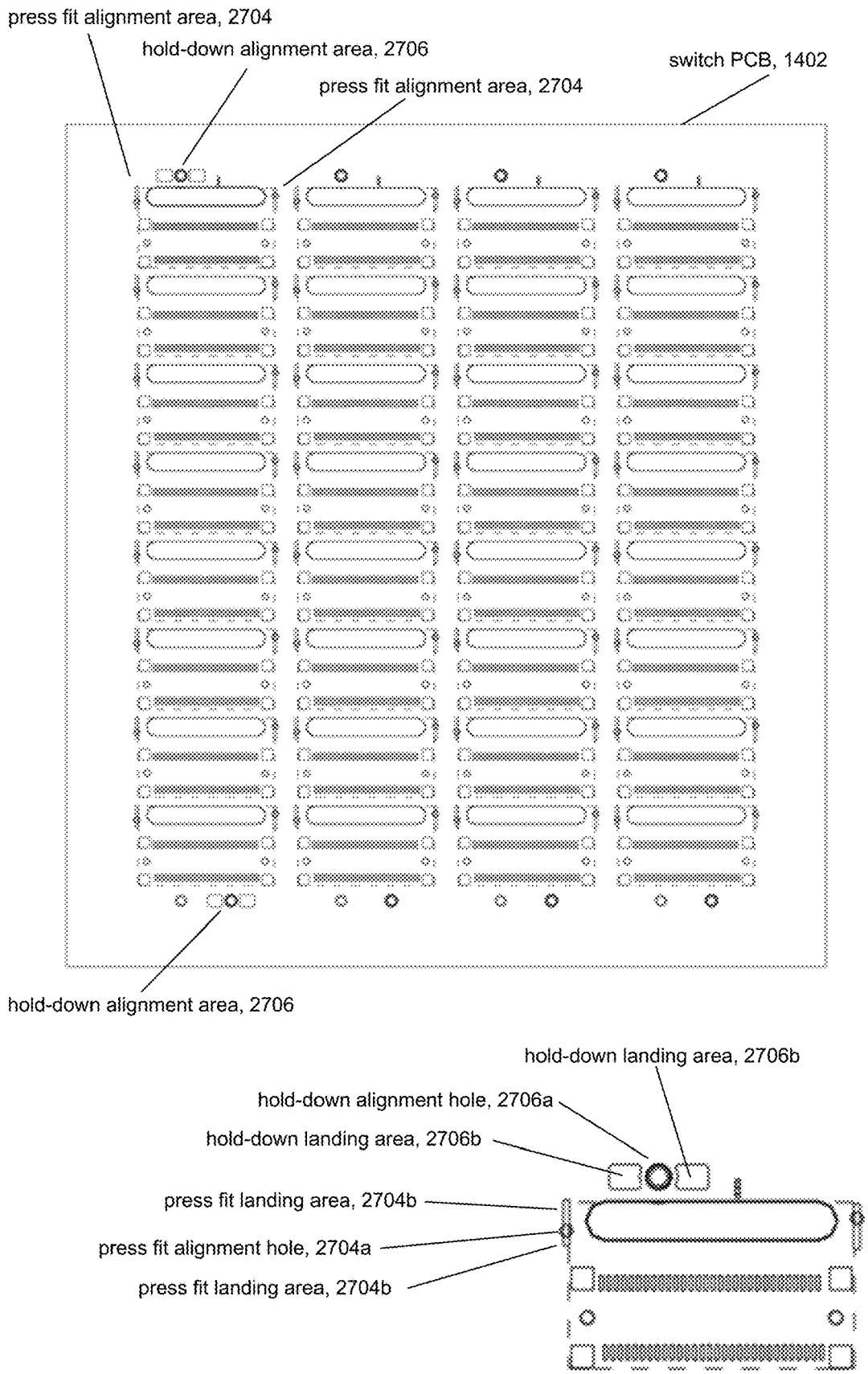
FIG. 27 illustrates alignment details in accordance with the present disclosure.

FIG. 27 shows the switch PCB 1402, highlighting details for supporting connector cage 2602. Switch PCB 1402 includes press fit alignment areas 2704 that correspond to press fit pins 2604 on the connector cage. The inset shows that each press fit area 2704 includes an alignment hole 2704*a* and landing areas 2704*b*. Press fit pins 2604 can be shaped as shown in FIG. 26, for example, to provide a friction fit when the connector cage is pressed into corresponding alignment holes 2704*a* in the switch PCB. Shoulders 2604*a* land on corresponding landing areas 2704*b* when the connector cage is mounted. The dimensions of shoulder 2604*a* can be readily and tightly controlled during fabrication of the connector cage thereby facilitating precise tolerance in the mounting of the connector cage onto the switch PCB.

Figure 28:
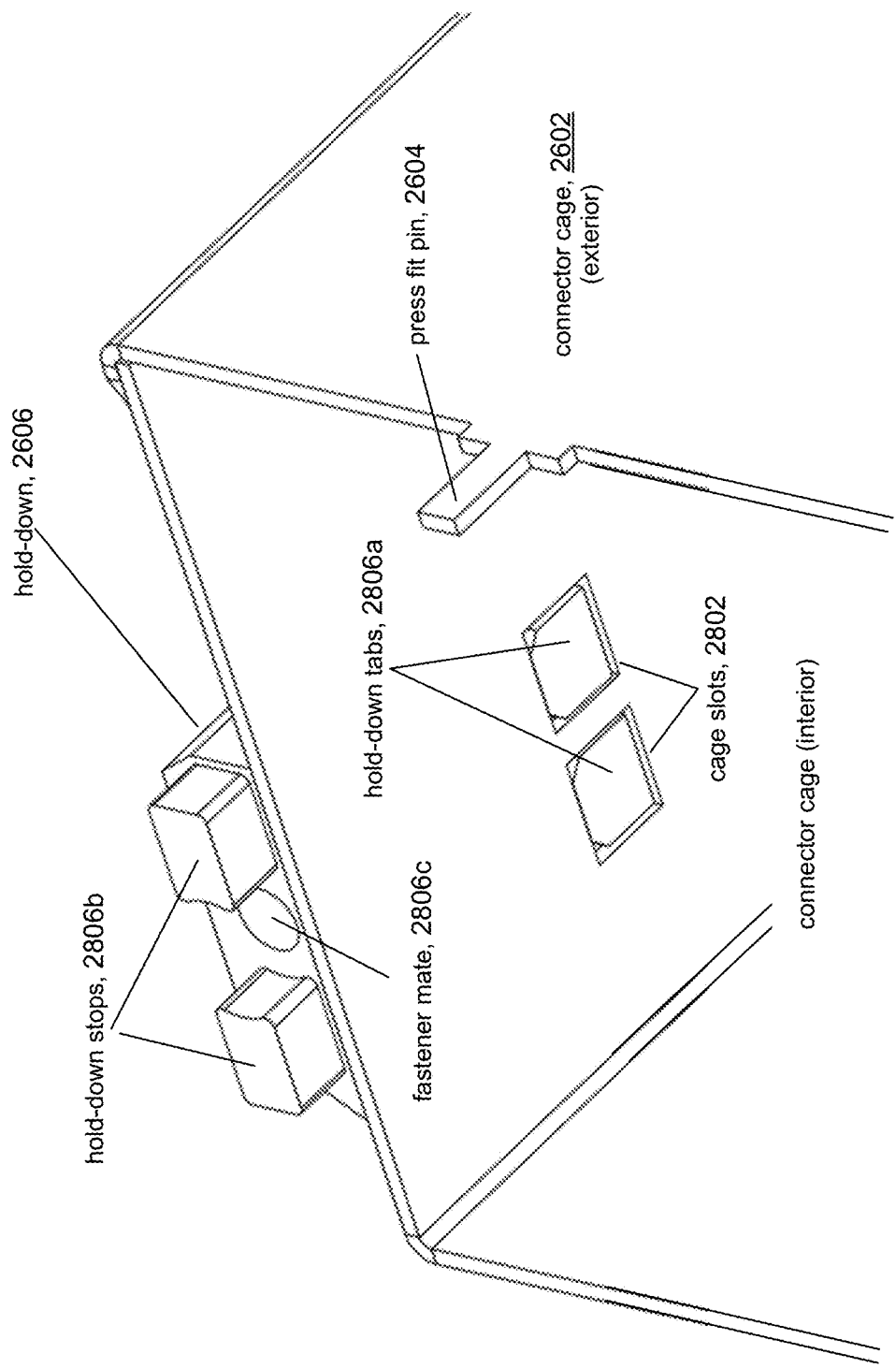
FIGS. 28 and 29 illustrate a hold-down feature in accordance with the present disclosure.

FIG. 28 shows details of hold-down mechanism 2606. The hold-down mechanism includes hold-down tabs 2806*a* which engage with cage slots 2802 formed in connector cage 2602. The hold-down mechanism further includes hold-down stops 2806*b* and a fastener mate 2806*c*.

Figure 29:
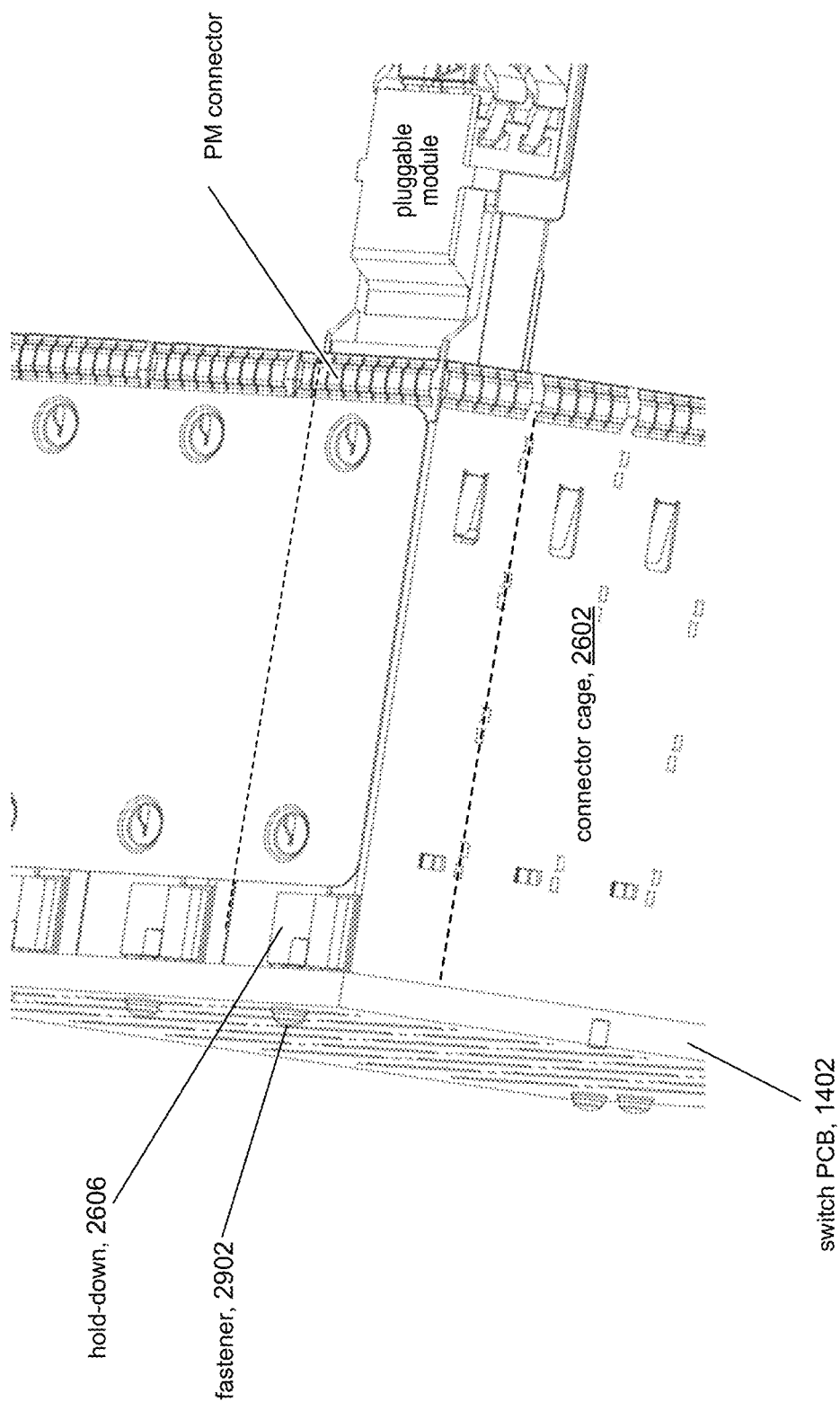

FIGS. 27, 28, and 29 show details of the operation of hold-down mechanism 2606. FIG. 29 shows a PM received in one of the PM connectors in connector cage 2602. A fastener 2902 (e.g., a machine screw, clip, etc.) passes through alignment hole 2706*a* formed through the switch PCB to engage fastener mate 2806*b* of hold-down mechanism 2606. As the fastener 2902 is tightened, the hold-down mechanism pulls the connector cage toward the switch PCB by virtue of the hold-down tabs 2806*a* engaged with the cage slots 2802. Also, as fastener 2902 is tightened, hold-down stops 2806*b* press against landing areas 2706*b* on the surface of the switch PCB. The shoulders 2604*a* of the press fit pins limit how much the cage can be pulled against the switch PCB. If the hold-down mechanism is formed of a suitably soft material (e.g., diecast metal), then continued tightening can cause the hold-down to deform rather than exert additional pulling force, thus providing a secure and firm attachment of the connector cage to the switch PCB.

Figure 30:
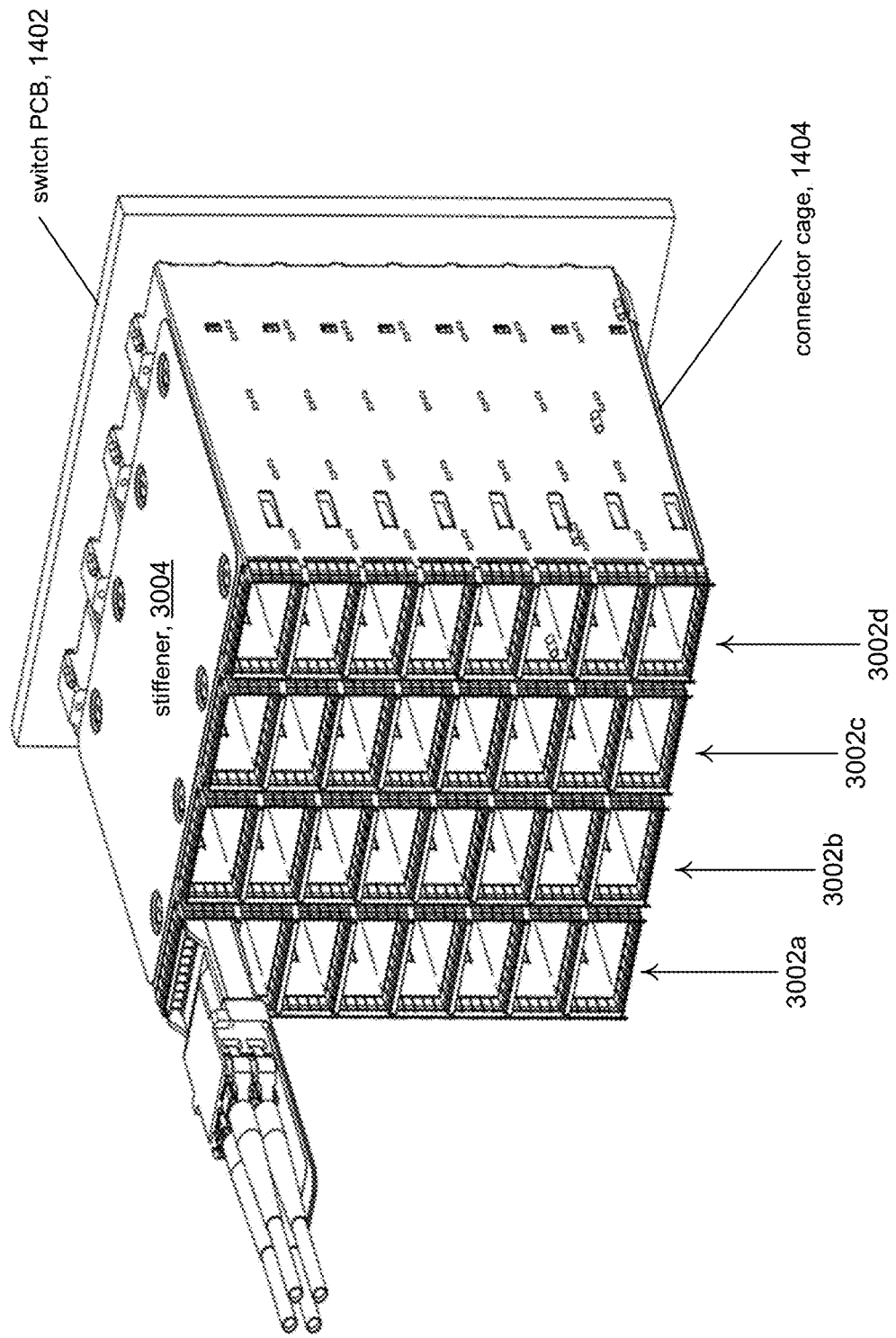
FIG. 30 illustrates a stiffener in accordance with the present disclosure.

FIG. 30 shows connector cage 1404 comprising four cage sub-units 3002*a*, 3002*b*, 3002*c*, 3002*d*. While the rear of the cage sub-units are mechanically stable by virtue of being attached to the switch PCB, the front of the cage sub-units is not as stable. Insertion and removal of pluggable modules will create flexing in the cage sub-units and over time can compromise the mechanical connection of the connector cage to the switch PCB. In some embodiments, a stiffener 3004 can be attached to the top sides of the cage sub-units to add mechanical stability to the connector cage. In some embodiments, a stiffener can be added to the bottom sides as well. The stiffener can be connected (e.g., snap fit) to some or all of the cage sub-units to provide mechanical stability. The stiffener can be a plate, metal strips, or any other suitable form factor.

FURTHER EXAMPLES (A1) A network switch comprising: an enclosure comprising a chassis and a front panel; and a switch card assembly comprising: a switch printed circuit card (PCB) arranged vertically within the chassis in parallel relation to the front panel; one or more switch chips mounted on the switch PCB; a plurality of airflow cutouts formed through the switch PCB; a plurality of pluggable module connectors mounted on the switch PCB, each pluggable module connector substantially aligned with a respective airflow cutout, wherein one or more lines of connector pins of said each pluggable module connector are substantially parallel to a long axis of the respective airflow cutout; the switch PCB having a plurality of PCB traces that connect the one or more switch chips to the plurality of pluggable module connectors, wherein the PCB traces include segments that cross a periphery of the pluggable module connectors and lie substantially parallel to rows of connector pins of the pluggable module connectors, wherein, when a pluggable module is received in a given pluggable module connector, the respective airflow cutout is in line with a heat sink of the pluggable module, wherein each pluggable module connector is mounted in perpendicular relation to the switch PCB so that a front end of said each pluggable module connector is accessible through the front panel of the network switch.

(A2) For the network switch denoted as (A1), wherein an electrical connector component of each pluggable module connector is housed in an electromagnetic interference (EMI) blocking or absorbing element to mitigate EMI radiation produced when a pluggable module is received in said each pluggable module connector and is operating.

(A3) For the network switch denoted as any of (A1) through (A2), wherein each pluggable module connector includes an airflow channel between the front end of the pluggable module connector and a back end of the pluggable module connector, wherein the switch PCB includes an airflow cutout substantially aligned with the airflow channel at the back end of said each pluggable module connector, wherein a portion of the EMI blocking or absorbing element is disposed in line with the airflow cutout associated with said each pluggable module connector and comprises openings to allow a flow of air to pass through the airflow cutout.

(A4) For the network switch denoted as any of (A1) through (A3), wherein each pluggable module connector includes an airflow channel between the front end of the pluggable module connector and a back end of the pluggable module connector, wherein the switch PCB includes an airflow cutout substantially aligned with the airflow channel at the back end of said each pluggable module connector, wherein an EMI blocking or absorbing element is disposed within the airflow cutout to mitigate EMI radiation produced when a pluggable module is received in said each pluggable module connector and is operating.

(A5) For the network switch denoted as any of (A1) through (A4), wherein each pluggable module connector includes an airflow channel between the front end of the pluggable module connector and a back end of the pluggable module connector, wherein the switch PCB includes an airflow cutout substantially aligned with the airflow channel at the back end of said each pluggable module connector, wherein the airflow cutout is plated with conductive material and grounded to mitigate EMI radiation produced when a pluggable module is received in said each pluggable module connector and is operating.

(A6) The network switch denoted as any of (A1) through (A5), further comprising a heatsink assembly in thermal contact with the one or more switch chips, the heatsink assembly including a heat dissipator having a front side exposed through openings of the front panel to ambient air that is available to be drawn in to cool the heat dissipator without having been preheated by heat-generating electronic components contained in the network switch.

(A7) The network switch denoted as any of (A1) through (A6), further comprising a fan unit configured to create an airflow that draws ambient air through the openings of the front panel and contacts the heat dissipator without being heated by the pluggable modules or electronic components on the switch card assembly.

(A8) The network switch denoted as any of (A1) through (A7), further comprising cold plates thermally coupled to the one or more switch chips, wherein a circulating liquid is used in the cold plates to remove heat generated by the one or more switch chips.

(B1) A network switch comprising: an enclosure comprising a chassis and a front panel; and a switch card assembly comprising: a switch printed circuit card (PCB) arranged vertically within the chassis in parallel relation to the front panel; one or more switch chips mounted on the switch PCB; a plurality of airflow cutouts formed through the switch PCB; a plurality of pluggable module connectors mounted on the switch PCB, each pluggable module connector substantially aligned between a respective pair of airflow cutouts, wherein said each pluggable module connector includes one or more lines of connector pins positioned between the respective pair of airflow cutouts; the switch PCB having a plurality of PCB traces that connect the one or more switch chips to the plurality of pluggable module connectors, wherein the PCB traces include segments that cross a periphery of the pluggable module connectors and lie substantially perpendicular to lines of connector pins of the pluggable module connectors, wherein each pluggable module connector is mounted in perpendicular relation to the switch PCB so that a front end of said each pluggable module connector is accessible through the front panel of the network switch.

(B2) For the network switch denoted as (B1), wherein an electrical connector component of each pluggable module connector is housed in an electromagnetic interference (EMI) blocking element to mitigate EMI radiation produced when a pluggable module is received in said each pluggable module connector and is operating.

(B3) For the network switch denoted as any of (B1) through (B2), wherein each pluggable module connector includes first and second airflow channels between the front end of the pluggable module connector and a back end of the pluggable module connector, wherein the respective pair of airflow cutouts are substantially aligned with the airflow channels at the back end of said each pluggable module connector.

(B4) For the network switch denoted as any of (B1) through (B3), wherein an electrical connector component of said each pluggable module connector is housed in an EMI blocking or absorbing element to mitigate EMI radiation produced when a pluggable module is received in said each pluggable module connector and is operating, wherein a portion of the EMI blocking or absorbing element is disposed in line with the airflow cutouts and perforated to allow a flow of air to pass through the airflow cutouts.

(B5) For the network switch denoted as any of (B1) through (B4), wherein an EMI blocking or absorbing element is disposed within the airflow cutouts to mitigate EMI radiation produced when a pluggable module is received in said each pluggable module connector and is operating.

(B6) The network switch denoted as any of (B1) through (B5), further including a heatsink assembly comprising a heat collector in thermal contact with the at least one switch chip and a heat dissipator disposed at the periphery of the switch PCB and in thermal communication with the heat collector.

(B7) For the network switch denoted as any of (B1) through (B6), wherein the heatsink assembly further comprises a second heat collector in thermal contact with a second switch chip and a second heat dissipator disposed at the periphery of the switch PCB and in thermal communication with the second heat collector.

(C1) A network switch comprising: an enclosure comprising a chassis and a front panel; a switch card assembly vertically arranged within the chassis in parallel relation to the front panel; and the switch card assembly comprising: a switch printed circuit board (PCB); and at least one connector cage mounted on the switch PCB and comprising a plurality of pluggable module connectors, wherein the pluggable module connectors are mounted on the switch PCB in an orientation to receive pluggable modules along a direction perpendicular to the switch PCB; first and second hold-down features to secure the connector cage in position on the switch PCB, the first hold-down feature engaged with a first side of the connector cage and fastened to the switch PCB, the second hold-down feature engaged with a second side of the connector cage, opposite the first side, and fastened to the switch PCB; and at least one stiffener attached to a side of the connector cage to reduce flexure of the connector cage.

(C2) For the network switch denoted as (C1), wherein the connector cage includes press fit pins that align to and pass through corresponding through holes formed through the switch PCB to control positioning of the connector cage on the switch PCB, the press fit pins including shoulders that land on an upper surface of the switch PCB to control a spacing between the connector cage and the switch PCB.

(C3) For the network switch denoted as any of (C1) through (C2), wherein each of the first and second hold-down features includes one or more tabs that engage with corresponding tab slots formed in the first and second sides of the connector cage, respectively.

(C4) For the network switch denoted as any of (C1) through (C3), wherein the stiffener comprises a plate positioned on a top side of the connector cage at a plurality of attachment points.

(C5) For the network switch denoted as any of (C1) through (C4), wherein the connector cage comprises a plurality of pluggable module connector sub-cages, wherein the stiffener comprises a plate disposed on a top side of the pluggable module connector sub-cages and has an attachment to each of the pluggable module connector sub-cages.

The above description illustrates various embodiments of the present disclosure along with examples of how aspects of the present disclosure may be implemented. The above examples and embodiments should not be deemed to be the only embodiments, and are presented to illustrate the flexibility and advantages of the present disclosure as defined by the following claims. Based on the above disclosure and the following claims, other arrangements, embodiments, implementations and equivalents may be employed without departing from the scope of the disclosure as defined by the claims.

The invention claimed is:

1. A network switch comprising:
an enclosure comprising a chassis and a front panel; and
a switch card assembly comprising:
a switch printed circuit card (PCB) arranged vertically within the chassis in parallel relation to the front panel;
one or more switch chips mounted on the switch PCB;
a plurality of airflow cutouts formed through the switch PCB;
a plurality of pluggable module connectors mounted on the switch PCB, each pluggable module connector substantially aligned with a respective airflow cutout, wherein one or more lines of connector pins of said each pluggable module connector are substantially parallel to a long axis of the respective airflow cutout;
the switch PCB having a plurality of PCB traces that connect the one or more switch chips to the plurality of pluggable module connectors, wherein the PCB traces include segments that cross a periphery of the pluggable module connectors and lie substantially parallel to rows of connector pins of the pluggable module connectors,
wherein, when a pluggable module is received in a given pluggable module connector, the respective airflow cutout is in line with a heat sink of the pluggable module,
wherein each pluggable module connector is mounted in perpendicular relation to the switch PCB so that a front end of said each pluggable module connector is accessible through the front panel of the network switch.

2. The network switch of claim 1, wherein an electrical connector component of each pluggable module connector is housed in an electromagnetic interference (EMI) blocking or absorbing element to mitigate EMI radiation produced when a pluggable module is received in said each pluggable module connector and is operating.

3. The network switch of claim 2, wherein each pluggable module connector includes an airflow channel between the front end of the pluggable module connector and a back end of the pluggable module connector, wherein one of the plurality of airflow cutouts is substantially aligned with the airflow channel at the back end of said each pluggable module connector, wherein a portion of the EMI blocking or absorbing element is disposed in line with the airflow cutout associated with said each pluggable module connector and comprises openings to allow a flow of air to pass through the airflow cutout.

4. The network switch of claim 1, wherein each pluggable module connector includes an airflow channel between the front end of the pluggable module connector and a back end of the pluggable module connector, wherein one of the plurality of airflow cutouts is substantially aligned with the airflow channel at the back end of said each pluggable module connector, wherein an EMI blocking or absorbing element is disposed within the airflow cutout to mitigate EMI radiation produced when a pluggable module is received in said each pluggable module connector and is operating.

5. The network switch of claim 1, wherein each pluggable module connector includes an airflow channel between the front end of the pluggable module connector and a back end of the pluggable module connector, wherein one of the plurality of airflow cutouts is substantially aligned with the airflow channel at the back end of said each pluggable module connector, wherein the airflow cutout is plated with conductive material and grounded to mitigate EMI radiation produced when a pluggable module is received in said each pluggable module connector and is operating.

6. The network switch of claim 1, further comprising a heatsink assembly in thermal contact with the one or more switch chips, the heatsink assembly including a heat dissipator having a front side exposed through openings of the front panel to ambient air that is available to be drawn in to cool the heat dissipator without having been preheated by heat-generating electronic components contained in the network switch.

7. The network switch of claim 6, further comprising a fan unit configured to create an airflow that draws ambient air through the openings of the front panel and contacts the heat dissipator without being heated by the pluggable modules or electronic components on the switch card assembly.

8. The network switch of claim 1, further comprising cold plates thermally coupled to the one or more switch chips, wherein a circulating liquid is used in the cold plates to remove heat generated by the one or more switch chips.

9. A network switch comprising:
an enclosure comprising a chassis and a front panel; and
a switch card assembly comprising:
a switch printed circuit card (PCB) arranged vertically within the chassis in parallel relation to the front panel;
one or more switch chips mounted on the switch PCB;
a plurality of airflow cutouts formed through the switch PCB;
a plurality of pluggable module connectors mounted on the switch PCB, each pluggable module connector substantially aligned between a respective pair of airflow cutouts, wherein said each pluggable module connector includes one or more lines of connector pins positioned between the respective pair of airflow cutouts;
the switch PCB having a plurality of PCB traces that connect the one or more switch chips to the plurality of pluggable module connectors, wherein the PCB traces include segments that cross a periphery of the pluggable module connectors and lie substantially perpendicular to lines of connector pins of the pluggable module connectors,
wherein each pluggable module connector is mounted in perpendicular relation to the switch PCB so that a front end of said each pluggable module connector is accessible through the front panel of the network switch.

10. The network switch of claim 9, wherein an electrical connector component of each pluggable module connector is housed in an electromagnetic interference (EMI) blocking element to mitigate EMI radiation produced when a pluggable module is received in said each pluggable module connector and is operating.

11. The network switch of claim 9, wherein each pluggable module connector includes first and second airflow channels between the front end of the pluggable module connector and a back end of the pluggable module connector, wherein the respective pair of airflow cutouts are substantially aligned with the airflow channels at the back end of said each pluggable module connector.

12. The network switch of claim 11, wherein an electrical connector component of said each pluggable module connector is housed in an EMI blocking or absorbing element to mitigate EMI radiation produced when a pluggable module is received in said each pluggable module connector and is operating, wherein a portion of the EMI blocking or absorbing element is disposed in line with the airflow cutouts and perforated to allow a flow of air to pass through the airflow cutouts.

13. The network switch of claim 11, wherein an EMI blocking or absorbing element is disposed within the airflow cutouts to mitigate EMI radiation produced when a pluggable module is received in said each pluggable module connector and is operating.

14. The switch card assembly of claim 9, further including a heatsink assembly comprising a heat collector in thermal contact with the at least one switch chip and a heat dissipator disposed at the periphery of the switch PCB and in thermal communication with the heat collector.

15. The switch card assembly of claim 14, wherein the heatsink assembly further comprises a second heat collector in thermal contact with a second switch chip and a second heat dissipator disposed at the periphery of the switch PCB and in thermal communication with the second heat collector.

* * * * *